United States Patent
Ebiko

(10) Patent No.: US 11,309,346 B2
(45) Date of Patent: Apr. 19, 2022

(54) IMAGING ELEMENT AND IMAGING APPARATUS

(71) Applicant: SONY SEMICONDUCTOR SOLUTIONS CORPORATION, Kanagawa (JP)

(72) Inventor: Yoshiki Ebiko, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 102 days.

(21) Appl. No.: 16/697,881

(22) Filed: Nov. 27, 2019

(65) Prior Publication Data
US 2020/0098818 A1   Mar. 26, 2020

Related U.S. Application Data

(63) Continuation of application No. 16/331,664, filed as application No. PCT/JP2018/030723 on Aug. 21, 2018, now Pat. No. 10,636,831.

(30) Foreign Application Priority Data

Aug. 30, 2017  (JP) ................. 2017-164981

(51) Int. Cl.
*H01L 27/146* (2006.01)
*H04N 5/359* (2011.01)
*H04N 5/374* (2011.01)

(52) U.S. Cl.
CPC ...... *H01L 27/14643* (2013.01); *H01L 27/146* (2013.01); *H01L 27/14625* (2013.01); *H04N 5/359* (2013.01); *H04N 5/374* (2013.01)

(58) Field of Classification Search
CPC ...................................................... G01S 17/89
See application file for complete search history.

(56) References Cited

U.S. PATENT DOCUMENTS

2014/0299843 A1* 10/2014 Kim ................... H01L 27/3262
                                                                257/40
2017/0289805 A1* 10/2017 Hong ................... H04W 12/08

FOREIGN PATENT DOCUMENTS

DE        19821974      11/1999
EP         1513202       3/2005
(Continued)

OTHER PUBLICATIONS

Extended European Search Report for European Patent Application No. 18850841.0, dated Apr. 28, 2020, 9 pages.
(Continued)

*Primary Examiner* — Thanh Luu
(74) *Attorney, Agent, or Firm* — Sheridan Ross P.C.

(57) ABSTRACT

The present technology relates to an imaging element and an imaging apparatus that can suppress color mixture. An imaging element includes a pixel array section including a plurality of pixels that photoelectrically converts incident light, the pixel including a first signal extraction section including an application electrode connected to a first drive line for application of voltage, and a suction electrode for detecting a signal carrier generated by the photoelectric conversion, and a second signal extraction section including an application electrode connected to a second drive line for application of voltage and a suction electrode, in which a distance from the first signal extraction section to the second signal extraction section shorter than a distance from the first signal extraction section of the predetermined pixel to the second signal extraction section of another pixel adjacent to the predetermined pixel. The present technology can be applied to an imaging apparatus.

17 Claims, 14 Drawing Sheets

(56) References Cited

FOREIGN PATENT DOCUMENTS

| EP | 2894492 | 10/2010 |
| EP | 2330637 | 7/2015 |
| JP | 2016-527482 | 9/2016 |

OTHER PUBLICATIONS

Official Action (with English translation) for Japan Patent Application No. 2019-510985, dated Jul. 13, 2021, 6 pages.

* cited by examiner

IMAGING ELEMENT AND IMAGING APPARATUS

CROSS REFERENCE TO RELATED APPLICATIONS

This application is a continuation of U.S. patent application Ser. No. 16/331,664, filed Mar. 8, 2019, which is a national stage application under 35 U.S.C. 371 and claims the benefit of PCT Application No. PCT/JP2018/030723 having an international filing date of Aug. 21, 2018, which designated the United States, which PCT application claimed the benefit of Japanese Patent Application No. 2017-164981 filed Aug. 30, 2017, the entire disclosures of each of which are incorporated herein by reference.

TECHNICAL FIELD

The present technology relates to an imaging element and an imaging apparatus, and more particularly to an imaging element and an imaging apparatus that can suppress color mixture.

BACKGROUND ART

Conventionally, a distance measurement system that uses an indirect time of flight (ToF) method has been known. Such a distance measurement system involves a sensor that can sort signal charges, which are obtained when light reflected as active light emitted with the use of a light emitting diode (LED) or a laser at a certain phase is incident on a subject is received, into different regions at high speed.

Thus, a technology has been proposed in which, for example, a wide range of region in a substrate can be modulated when at high speed such that a voltage directly applied to a substrate of a sensor to generate current in the substrate (see, for example, Patent Document 1). Such a sensor is also called a current assisted photonic demodulator (CAPD) sensor.

The CAPD sensor includes application electrodes to which a voltage is applied and a suction electrode for collecting charges. When a voltage is applied to one of the two application electrodes, which are paired, current is generated between the application electrodes, and a signal charge generated by photoelectric conversion is guided to and collected by the suction electrode.

CITATION LIST

Patent Document

Patent Document 1: Japanese Patent Application Laid-Open No. 2011-86904

SUMMARY OF THE INVENTION

Problems to be Solved by the Invention

However, with the aforementioned CAPD sensor, in some cases, a signal charge generated by photoelectric conversion is collected by an unintended suction electrode so that color mixture is generated. When such color mixture is generated, the resolution of an image indicating a distance to an object in each region, which is obtained by the CAPD sensor, is deteriorated, resulting in a reduction in distance measurement accuracy.

The present technology has been made in view of such circumstances and can suppress color mixture.

Solutions to Problems

An imaging element of a first aspect of the present technology includes a pixel array section including a plurality of pixels that photoelectrically converts incident light;

the pixel including a first signal extraction section including an application electrode connected to a first drive line for application of voltage, for generating an electric field by the application of the voltage, and a suction electrode for detecting a signal carrier generated by the photoelectric conversion, and a second signal extraction section including an application electrode connected to a second drive line for application of voltage and the suction electrode, in which a distance from the first signal extraction section of the predetermined pixel to the second signal extraction section of the predetermined pixel is shorter than a distance from the first signal extraction section of the predetermined pixel to the second signal extraction section of another pixel adjacent to the predetermined pixel.

In the first aspect of the present technology, an imaging element includes a pixel array section including a plurality of pixels that photoelectrically converts incident light;

the pixel including a first signal extraction section including an application electrode connected to a first drive line for application of voltage, for generating an electric field by the application of the voltage, and a suction electrode for detecting a signal carrier generated by the photoelectric conversion, and a second signal extraction section including an application electrode connected to a second drive line for application of voltage and the suction electrode, in which a distance from the first signal extraction section of the predetermined pixel to the second signal extraction section of the predetermined pixel is shorter than a distance from the first signal extraction section of the predetermined pixel to the second signal extraction section of another pixel adjacent to the predetermined pixel.

An imaging apparatus of a second aspect of the present technology is an imaging apparatus similar to the imaging element of the first aspect.

Effects of the Invention

According to the first aspect and the second aspect of the present technology, color mixture can be suppressed.

Note that effects described herein are not necessarily limited, but may also be any of those described in the present disclosure.

MODE FOR CARRYING OUT THE INVENTION

An embodiment to which the present technology has been applied is described below with reference to the drawings.

First Embodiment

Configuration Example of the Solid-State Imaging Element

The present technology can suppress generation of color mixture between adjacent pixels in a CAPD sensor in such a way that a signal extraction section including an application electrode to which a voltage is not applied in a predetermined pixel and a signal extraction section in which an application electrode to which a positive voltage is applied in a pixel adjacent to the predetermined pixel are arranged in a distant state.

The present technology can be applied, for example, to a solid-state imaging element constituting a distance measurement system that performs distance measurement by means of an indirect ToF method, an imaging apparatus including such a solid-state imaging element, or the like.

For example, a distance measurement system is mounted on a vehicle and can be applied to an automotive system that measures a distance to a subject present outside the car, a gesture recognition system that measures a distance to a subject, e.g., a user's hand, and recognizes the user's gesture on the basis of results of the measurement, or the like. In this case, the results of the gesture recognition can be used, for example, for operation of a car navigation system and the like.

Figure 1:
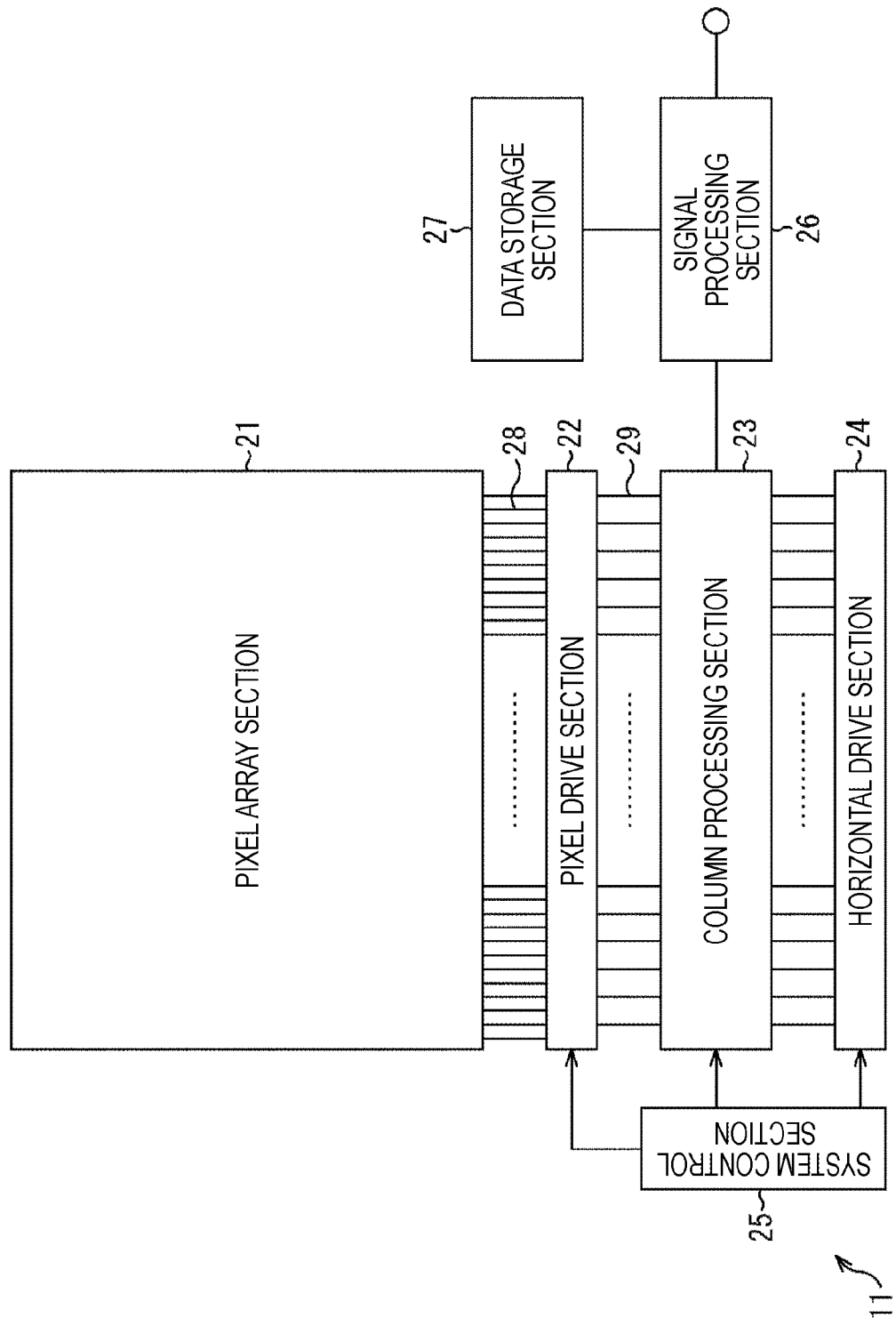
FIG. 1 is a diagram illustrating a configuration example of a solid-state imaging element.

FIG. 1 is a diagram illustrating a configuration example of an embodiment of a solid-state imaging element to which the present technology has been applied.

A solid-state imaging element 11 illustrated in FIG. 1 is a back illuminated-type CAPD sensor and is provided on an imaging apparatus having a distance measurement function.

The solid-state imaging element 11 includes a pixel array section 21 formed on a semiconductor substrate, which is not illustrated, and a peripheral circuit section integrated on the semiconductor substrate, which is the same as the semiconductor substrate where the pixel array section 21 is provided. The peripheral circuit section includes, for example, a pixel drive section 22, a column processing section 23, a horizontal drive section 24, and a system control section 25.

The solid-state imaging element 11 further includes a signal processing section 26 and a data storage section 27. Note that the signal processing section 26 and the data storage section 27 may be mounted on the same substrate as the substrate where the solid-state imaging element 11 is provided or may be arranged on a substrate, which is different from the substrate where the solid-state imaging element 11 of the imaging apparatus is provided.

The pixel array section 21 is configured such that unit pixels (hereinafter simply referred to as the pixels) that produce charges corresponding to the amount of received light and output a signal corresponding to the charges are arranged in a row direction and in a column direction, i.e., two-dimensionally arranged in a row and column pattern. In other words, the pixel array section 21 includes a plurality of pixels that photoelectrically converts incident light and outputs a signal corresponding to resultant charges.

Here, the row direction indicates a pixel arrangement direction of a pixel row, i.e., a horizontal direction, and the column direction indicates a pixel arrangement direction of a pixel column, i.e., a vertical direction. The row direction is a lateral direction in the drawing, and the column direction is a longitudinal direction in the drawing.

In the pixel array section 21, a pixel drive line 28 or a vertical signal line 29 is wired along the column direction with respect to each pixel column with regard to the pixel arrangement in the row and column pattern.

For example, the pixel drive line 28 transmits a drive signal or the like for performing driving in reading out a signal from the pixel. Note that one wiring is illustrated with respect to the pixel drive line 28 in FIG. 1, but a plurality of pixel drive lines is connected to one pixel in practice. One end of the pixel drive line 28 is connected to an output end corresponding to each column of the pixel drive section 22. Furthermore, two vertical signal lines 29 are connected to each pixel column.

The pixel drive section 22 includes a shift register, an address decoder, or the like, and drives all pixels simultaneously or pixels in units of columns with respect to each pixel of the pixel array section 21. In other words, the pixel drive section 22 constitutes a drive section that controls the operation of each pixel of the pixel array section 21 together with the system control section 25 that controls the pixel drive section 22. Note that, apart from the pixel drive section 22, a vertical drive section that drives pixels of the pixel array section 21 in units of rows may also be provided.

A signal output from each pixel of the pixel column in response to drive control by the pixel drive section 22 is input to the column processing section 23 through the vertical signal line 29. The column processing section 23 performs predetermined signal processing with respect to a signal output through the vertical signal line 29 from each pixel and temporarily holds a pixel signal after the signal processing.

Specifically, the column processing section 23 performs denoising processing, analog-to-digital (AD) conversion processing, or the like, as the signal processing.

The horizontal drive section 24 includes a shift register, an address decoder, or the like, and selects a unit circuit corresponding to the pixel column of the column processing section 23 in sequence. By selection scanning by the horizontal drive section 24, pixel signals subjected to the signal processing with respect to each unit circuit in the column processing section 23 are output in sequence.

The system control section 25 includes a timing generator that produces various types of timing signals or the like and performs drive control of the pixel drive section 22, the column processing section 23, the horizontal drive section 24, or the like on the basis of various types of timing signals produced by the timing generator.

The signal processing section 26 at least has an arithmetic processing function and performs various signal processing such as arithmetic processing on the basis of the pixel signal output from the column processing section 23. For signal processing in the signal processing section 26, the data storage section 27 temporarily stores data required for the processing.

Configuration Example of the Pixel

Next, a configuration example of a pixel provided in the pixel array section 21 is described. The pixel provided in the pixel array section 21 is configured, for example, in the manner illustrated in FIG. 2.

Figure 2:
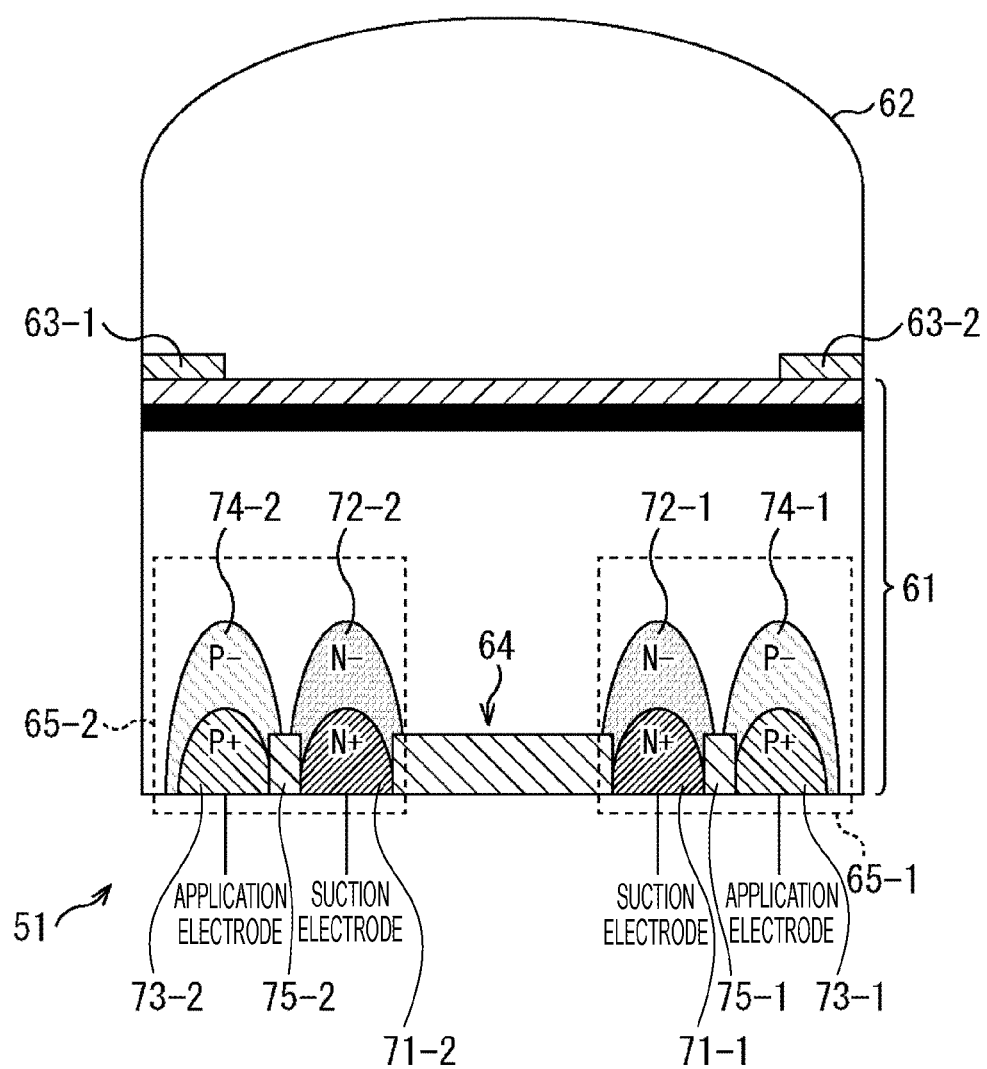
FIG. 2 is a diagram illustrating a configuration example of a pixel.

FIG. 2 illustrates a cross section of one pixel 51 provided in the pixel array section 21. The pixel 51 receives light incident from the outside, particularly infrared light, and performs photoelectric conversion, and outputs a signal corresponding to the resultant charge.

The pixel 51 includes a substrate 61, which is, for example, a silicon substrate, i.e., a P-type semiconductor substrate including a P-type semiconductor region, and an on-chip lens 62 formed on the substrate 61.

In the drawing, the substrate 61, for example, is configured such that a thickness in a longitudinal direction, i.e., a thickness in a direction perpendicular to the plane of the substrate 61 is 20 μm or less. Note that the substrate 61 may of course have a thickness of 20 μm or more, and the thickness may be determined according to target characteristics or the like of the solid-state imaging element 11.

In the drawing, an upper side front surface of the substrate 61, i.e., a surface of the substrate 61 onto which light from the outside is incident (hereinafter, also referred to as the incident surface) includes the on-chip lens 62 that collects incident light from the outside and causes the light to be incident into the substrate 61.

Furthermore, the pixel 51 includes, at an end portion of the pixel 51 on the incident surface of the substrate 61, an inter-pixel light shielding section 63-1 and an inter-pixel light shielding section 63-2 that prevent color mixture between adjacent pixels.

In this example, the light from the outside is incident into the substrate 61 via the on-chip lens 62, but the incident light from the outside does not pass through a part of the on-chip lens 62 or the substrate 61 so as to be incident on a region of another pixel provided adjacent to the pixel 51 of the substrate 61. In other words, the light incident on the on-chip lens 62 from the outside and directed toward the inside of the other pixel adjacent to the pixel 51 is shielded by the inter-pixel light shielding section 63-1 or the inter-pixel light shielding section 63-2 so as not to be incident into the other adjacent pixel. The inter-pixel light shielding section 63-1 and the inter-pixel light shielding section 63-2 are also simply referred to as the inter-pixel light shielding section 63 below in a case where distinction is not particularly necessary.

The solid-state imaging element 11 is a back illuminated-type CAPD sensor. Therefore, the incident surface of the substrate 61 is so-called a back surface, and the back surface does not include a wiring layer including a wire or the like. Furthermore, a part of a surface opposite to the incident surface of the substrate 61 includes a stack of wiring layers including a wire for driving a transistor or the like formed in the pixel 51, a wire for reading out a signal from the pixel 51, or the like.

A side of a surface opposite to the incident surface in the substrate 61, i.e., an inner side part of a lower surface in the drawing includes an oxide film 64, and a signal extraction section 65-1 and a signal extraction section 65-2, which are called taps.

In this example, a central part of the pixel 51 near the surface opposite to the incident surface of the substrate 61 includes the oxide film 64. The oxide film 64 includes at both ends the signal extraction section 65-1 and the signal extraction section 65-2, respectively.

Here, the signal extraction section 65-1 includes an N+ semiconductor region 71-1 and an N− semiconductor region 72-1, which are an N-type semiconductor region, and a P+ semiconductor region 73-1 and a P− semiconductor region 74-1, which are a P-type semiconductor region.

In other words, the N+ semiconductor region 71-1 is formed in a position adjacent to the right side of the oxide film 64 in the drawing at an inner side part of the front surface, which is a surface opposite to the incident surface of the substrate 61. Furthermore, the N− semiconductor region 72-1 is formed on the upper side of the N+ semiconductor region 71-1 in the drawing to cover (surround) the N+ semiconductor region 71-1.

Moreover, the P+ semiconductor region 73-1 is formed in a position adjacent to the right side of N+ semiconductor region 71-1 in the drawing at an inner side part of the front surface, which is a surface opposite to the incident surface of the substrate 61. Furthermore, the P− semiconductor region 74-1 is formed on the upper side of the P+ semiconductor region 73-1 in the drawing to cover (surround) the P+ semiconductor region 73-1.

Note that, although not illustrated here, in more detail, the N+ semiconductor region 71-1 and the N− semiconductor region 72-1 are formed to surround the circumference of the P+ semiconductor region 73-1 and the P− semiconductor region 74-1 about the P+ semiconductor region 73-1 and the P− semiconductor region 74-1 when the substrate 61 is viewed from a direction perpendicular to the plane of the substrate 61.

Similarly, the signal extraction section 65-2 includes an N+ semiconductor region 71-2 and an N− semiconductor region 72-2, which are an N-type semiconductor region, and a P+ semiconductor region 73-2 and a P− semiconductor region 74-2, which are a P-type semiconductor region.

In other words, the N+ semiconductor region 71-2 is formed in a position adjacent to the left side of the oxide film 64 in the drawing at an inner side part of the front surface, which is a surface opposite to the incident surface of the substrate 61. Furthermore, the N− semiconductor region 72-2 is formed on the upper side of the N+ semiconductor region 71-2 in the drawing to cover (surround) the N+ semiconductor region 71-2.

Moreover, the P+ semiconductor region 73-2 is formed in a position adjacent to the left side of N+ semiconductor region 71-2 in the drawing at an inner side part of the front surface, which is a surface opposite to the incident surface of the substrate 61. Furthermore, the P− semiconductor region 74-2 is formed on the upper side of the P+ semiconductor region 73-2 in the drawing to cover (surround) the P+ semiconductor region 73-2.

Note that, although not illustrated here, in more detail, the N+ semiconductor region 71-2 and the N− semiconductor region 72-2 are formed to surround the circumference of the P+ semiconductor region 73-2 and the P− semiconductor region 74-2 about the P+ semiconductor region 73-2 and the P− semiconductor region 74-2 when the substrate 61 is viewed from a direction perpendicular to the plane of the substrate 61.

The signal extraction section 65-1 and the signal extraction section 65-2 are also simply referred to as the signal extraction section 65 below in a case where distinction is not particularly necessary.

Furthermore, the N+ semiconductor region 71-1 and the N+ semiconductor region 71-2 are also simply referred to as the N+ semiconductor region 71 below in a case where distinction is not particularly necessary, and the N− semiconductor region 72-1 and the N− semiconductor region 72-2 are also simply referred to as the N− semiconductor region 72 below in a case where distinction is not particularly necessary.

Moreover, the P+ semiconductor region 73-1 and the P+ semiconductor region 73-2 are also simply referred to as the P+ semiconductor region 73 below in a case where distinction is not particularly necessary, and the P− semiconductor region 74-1 and the P− semiconductor region 74-2 are also simply referred to as the P− semiconductor region 74 below in a case where distinction is not particularly necessary.

Furthermore, between the N+ semiconductor region 71-1 and the P+ semiconductor region 73-1, the substrate 61 includes a separation section 75-1 that separates these regions and includes an oxide film or the like. Similarly, also between the N+ semiconductor region 71-2 and the P+ semiconductor region 73-2, a separation section 75-2 that separates these regions includes an oxide film or the like. The separation section 75-1 and the separation section 75-2 are also simply referred to as the separation section 75 below in a case where distinction not particularly necessary.

The N+ semiconductor region 71 provided on the substrate 61 is a suction electrode that functions as a detection section for detecting the amount of light incident onto the pixel 51 from the outside, i.e., the amount of signal carriers generated by photoelectric conversion by the substrate 61. In other words, the N+ semiconductor region 71 is a suction electrode that collects charges (electrons) generated by the photoelectric conversion by the substrate 61.

Furthermore, the P+ semiconductor region 73 is an application electrode that functions as an injection contact section for injecting a lot of carrier current into the substrate 61, i.e., for generating an electric field in the substrate 61 by direct application of a voltage to the substrate 61.

Regarding the pixel 51, a floating diffusion (FD) section, which is a floating diffusion region, which is not illustrated, (hereinafter also particularly referred to as the FD section A), is directly connected to the N+ semiconductor region 71-1. Furthermore, the FD section A is connected to the vertical signal line 29 via an amplification transistor or the like, which is not illustrated.

Similarly, another FD section (hereinafter, particularly referred to as the FD section B), which is different from the FD section A, is directly connected to the N+ semiconductor region 71-2. Furthermore, the FD section B is connected to the vertical signal line 29 via an amplification transistor or the like, which is not illustrated. Here, the FD section A and the FD section B are connected to the vertical signal lines 29 which are different from each other.

For example, in a case where a distance to a subject is measured by means of the indirect ToF method, infrared light is emitted toward the subject from the imaging apparatus including the solid-state imaging element 11. Then, when the infrared light is reflected off the subject and returns to the imaging apparatus as the reflected light, the substrate 61 of the solid-state imaging element 11 receives the incident reflected light (infrared light) and performs photoelectric conversion.

At this time, the pixel drive section 22 drives the pixel 51 and sorts signals corresponding to the charges obtained by the photoelectric conversion into the FD section A and the FD section B.

For example, at certain timing, the pixel drive section 22 applies a voltage to the two P+ semiconductor regions 73 via the pixel drive line 28, a contact, or the like.

Specifically, for example, the pixel drive section 22 applies a positive voltage greater than 0 V to the P+ semiconductor region 73-1 via the pixel drive line 28 and applies a voltage of 0 V to the P+ semiconductor region 73-2 via the pixel drive line 28. In other words, a positive voltage is applied to the P+ semiconductor region 73-1, and a voltage is practically not applied to the P+ semiconductor region 73-2.

When a voltage is applied to the P+ semiconductor region 73 as described above, an electric field is generated between the two P+ semiconductor regions 73 of the substrate 61, and current flows from the P+ semiconductor region 73-1 to the P+ semiconductor region 73-2. In this case, a hole in the substrate 61 is moved in a direction of the P+ semiconductor region 73-2, and an electron is moved in a direction of the P+ semiconductor region 73-1.

Thus, when infrared light (reflected light) is incident into the substrate 61 from the outside via the on-chip lens 62 in the aforementioned state and the infrared light is photoelectrically converted in the substrate 61 into a pair of an electron and a hole, the resultant electron is guided in a direction of the P+ semiconductor region 73-1 and moved into the N+ semiconductor region 71-1 by the electric field between the P+ semiconductor regions 73.

In this case, the electron generated by the photoelectric conversion is used as a signal carrier for detecting a signal corresponding to the amount of infrared light incident on the pixel 51, i.e., the amount of received light of the infrared light.

Thus, a charge corresponding to the electron moved into the N+ semiconductor region 71-1 is accumulated in the N+ semiconductor region 71-1, and this charge is detected by the column processing section 23 via the FD section A, the amplification transistor, the vertical signal line 29, or the like.

In other words, an accumulated charge of the N+ semiconductor region 71-1 is transferred to the FD section A, which is directly connected to the N+ semiconductor region 71-1. A signal corresponding to the charge transferred to the FD section A is read out by the column processing section 23 via the amplification transistor or the vertical signal line 29. Then, processing, e.g., AD conversion processing, is performed on the read-out signal by the column processing section 23, and the resultant pixel signal is fed to the signal processing section 26.

This pixel signal is a signal indicating the amount of charges corresponding to the electron detected by the N+ semiconductor region 71-1, i.e., the amount of charges accumulated on the FD section A. In other words, it can be said that the pixel signal is also a signal that indicates the amount of infrared light received by the pixel 51.

Furthermore, at next timing, a voltage is applied to the two P+ semiconductor regions 73 by the pixel drive section 22 via the pixel drive line 28, a contact, or the like such that an electric field in the direction opposite to the electric field that has been generated in the substrate 61 is generated. Specifically, for example, a positive voltage is applied to the P+ semiconductor region 73-2, and a voltage of 0 V is applied to the P+ semiconductor region 73-1.

Thus, an electric field is generated between the two P+ semiconductor regions 73 of the substrate 61, and current flows from the P+ semiconductor region 73-2 to the P+ semiconductor region 73-1.

When infrared light (reflected light) is incident into the substrate 61 from the outside via the on-chip lens 62 in the aforementioned state and the infrared light is photoelectrically converted in the substrate 61 into a pair of an electron and a hole, the resultant electron is guided in a direction of the P+ semiconductor region 73-2 and moved into the N+ semiconductor region 71-2 by the electric field between the P+ semiconductor regions 73.

Thus, a charge corresponding to the electron moved into the N+ semiconductor region 71-2 is accumulated in the N+ semiconductor region 71-2, and this charge is detected by the column processing section 23 via the FD section B, the amplification transistor, the vertical signal line 29, or the like.

In other words, an accumulated charge of the N+ semiconductor region 71-2 is transferred to the FD section B, which is directly connected to the N+ semiconductor region 71-2. A signal corresponding to the charge transferred to the FD section B is read out by the column processing section 23 via the amplification transistor or the vertical signal line 29. Then, processing, e.g., AD conversion processing, is performed on the read-out signal by the column processing section 23, and the resultant pixel signal is fed to the signal processing section 26.

Thus, when the pixel signals obtained by the photoelectric conversion in different periods of time are obtained in the same pixel 51, the signal processing section 26 calculates distance information indicating a distance to the subject on the basis of the pixel signals and outputs the distance information to a subsequent stage.

In particular, regarding the signal processing section 26, when the distance information obtained with respect to the pixel of the pixel array section 21 is set to a pixel value of a pixel on an image corresponding to the pixel, an image indicating a distance to the object present in each region of an observation field of the solid-state imaging element 11 (hereinafter also referred to as the distance image) is obtained. The distance image thus obtained is also called a depth map.

The method in which signal carriers are sorted into different N+ semiconductor regions 71 as described above and distance information is calculated on the basis of a signal corresponding to the signal carrier is called an indirect ToF method.

Figure 3:
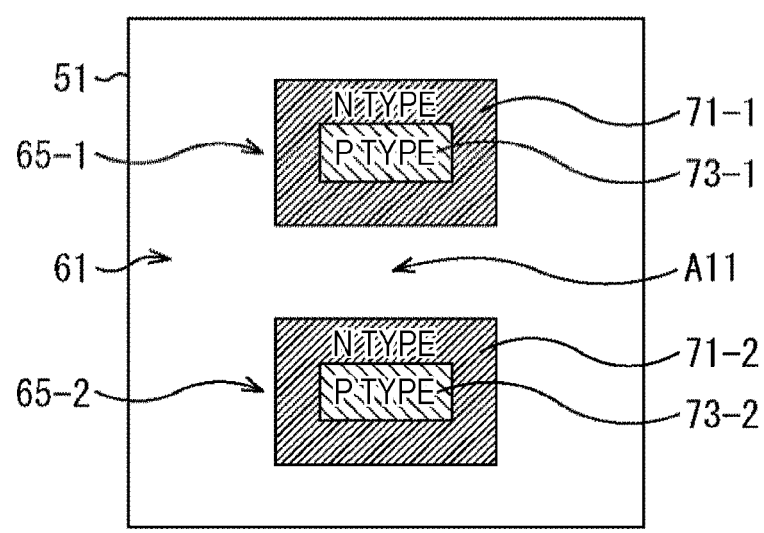
FIG. 3 is a diagram illustrating a configuration example of a part of a signal extraction section of a pixel.

Furthermore, when a part of the signal extraction section 65 of the pixel 51 is viewed in a direction from top to bottom, i.e., in a direction perpendicular to the plane of the substrate 61 in FIG. 2, the structure can be seen in which the circumference of the P+ semiconductor region 73 is surrounded by the N+ semiconductor region 71 as illustrated, for example, in FIG. 3. Note that Portions in FIG. 3 corresponding to those of FIG. 2 are designated by the same reference numerals, and description is omitted as appropriate.

In the example illustrated in FIG. 3, the oxide film 64, which is not illustrated, is formed at a central part of the pixel 51, and the signal extraction section 65 is formed at a portion on a slightly end side from the middle of the pixel 51. In particular, here, two signal extraction sections 65 are formed in the pixel 51.

Then, each signal extraction section 65 includes the P+ semiconductor region 73 having a rectangular shape at a central position. The circumference of the P+ semiconductor region 73 is surrounded by the N+ semiconductor region 71 having a rectangular shape, in more detail, a rectangular frame shape, about the P+ semiconductor region 73. In other words, the N+ semiconductor region 71 is formed to surround the circumference of the P+ semiconductor region 73.

Furthermore, in the pixel 51, the on-chip lens 62 is formed such that the infrared light incident from the outside is condensed onto a central part of the pixel 51, i.e., a portion indicated by arrow A11. In other words, the infrared light incident on the on-chip lens 62 from the outside is condensed to the position indicated by arrow A11, i.e., in FIG. 2, an upper side position of the oxide film 64 of FIG. 2, by the on-chip lens 62.

Therefore, the infrared light is condensed to a position between the signal extraction section 65-1 and the signal extraction section 65-2. Thus, it is possible to suppress that the infrared light is incident on a pixel adjacent to the pixel 51 and color mixture is generated, and it is also possible to suppress that the infrared light is directly incident on the signal extraction section 65.

Note that the signal extraction section 65 (tap) at which reading out of a signal corresponding to the charge (electron) obtained by photoelectric conversion is performed, i.e., the signal extraction section 65 at which the charge obtained by the photoelectric conversion is to be detected, is also referred to as an active tap below.

In contrast, the signal extraction section 65 (tap) at which reading out of a signal corresponding to a charge obtained by the photoelectric conversion is not performed, i.e., the signal extraction section 65 which is not an active tap, is also referred to as an inactive tap.

In the aforementioned example, the signal extraction section 65 at which a positive voltage is applied to the P+ semiconductor region 73 is an active tap, and the signal extraction section 65 at which a voltage of 0 V is applied to the P+ semiconductor region 73 is an inactive tap.

Furthermore, in the example illustrated in FIG. 3, the example is described in which the signal extraction section 65 including the P+ semiconductor region 73 and the N+ semiconductor region 71 has a rectangular shape. However, the signal extraction section 65 may have any other shape, e.g., a circular shape.

Regarding Drive of the Pixel

Incidentally, each pixel of the pixel array section 21 includes two signal extraction sections. In the case of drive of the pixel array section 21, active taps or inactive taps of adjacent pixels are adjacent to each other as illustrated, for example, in FIG. 4. Note that portions in FIG. 4 corresponding to those of FIG. 1 are designated by the same reference numerals, and description is omitted as appropriate.

Figure 4:
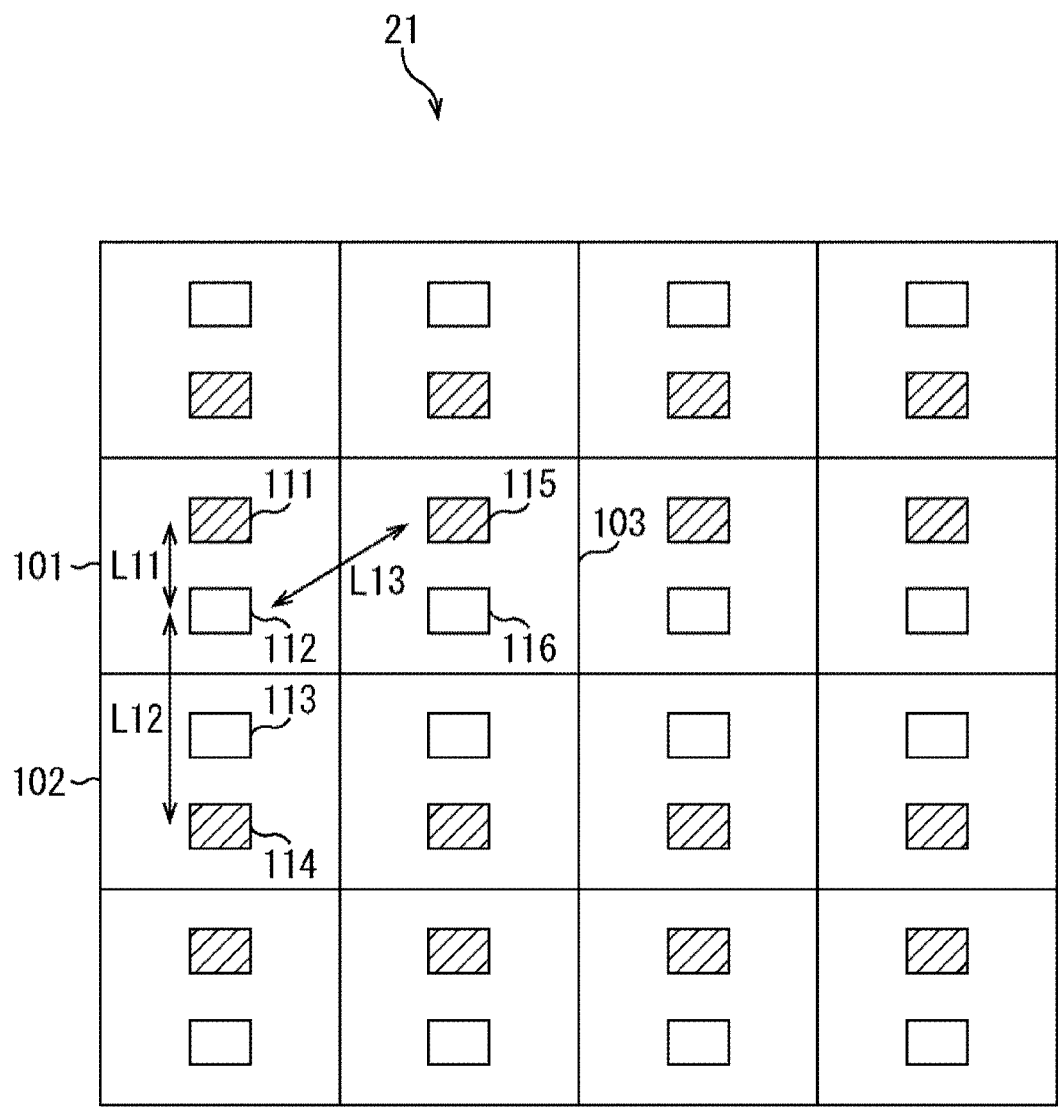
FIG. 4 is a diagram explaining arrangement of a signal extraction section in a pixel.

In FIG. 4, respective rectangular shapes adjacently aligned correspond to the pixels provided on the pixel array section 21, i.e., the pixel 51 illustrated in FIG. 2, and respective rectangular shapes in the pixels correspond to the signal extraction section 65.

In particular, a hatched rectangular shape in each pixel indicates a signal extraction section, which is an active tap at a predetermined timing, and an unhatched rectangular shape indicates a signal extraction section, which is an inactive tap at a predetermined timing.

Specifically, for example, each of a pixel 101 to a pixel 103 corresponds to the pixel 51 illustrated in FIG. 2, and the pixels 101 to the pixel 103 have a configuration similar to the configuration of the pixel 51.

In particular, the pixel 101 includes a signal extraction section 111 and a signal extraction section 112. The signal extraction section 111 and the signal extraction section 112 correspond to the signal extraction section 65 of the pixel 51.

Similarly, the pixel 102 includes a signal extraction section 113 and a signal extraction section 114. The signal extraction section 113 and the signal extraction section 114 correspond to the signal extraction section 65 of the pixel 51.

Furthermore, the pixel 103 includes a signal extraction section 115 and a signal extraction section 116. The signal extraction section 115 and the signal extraction section 116 correspond to the signal extraction section 65 of the pixel 51.

In this way, in the pixel array section 21, the signal extraction sections are arranged to be aligned in a direction of the pixel column (column direction), i.e., in a longitudinal direction in the drawing.

In particular, here, the signal extraction sections are arranged at equal intervals in the longitudinal direction in the drawing.

For example, assuming that a distance L11 between the signal extraction section 111 and the signal extraction section 112, which are aligned adjacent to each other in the longitudinal direction, is 5 μm in the drawing, a distance between the signal extraction section 112 and the signal extraction section 113, which are aligned adjacent to each other in the longitudinal direction, is also 5 μm in the drawing.

Furthermore, a distance between the signal extraction section 113 and the signal extraction section 114, which are aligned adjacent to each other in the longitudinal direction, is also 5 μm in the drawing. Therefore, a distance L12 between the signal extraction section 112 and the signal extraction section 114 is 10 μm.

Moreover, the signal extraction sections are also arranged at equal intervals in a lateral direction in the drawing. Here, for example, a distance between the signal extraction section 111 and a signal extraction section 115, which are aligned adjacent to each other in the lateral direction in the drawing, and a distance between the signal extraction section 112 and a signal extraction section 116, which are aligned adjacent to each other in the lateral direction in the drawing, are both 10 μm.

A conceivable method as general pixel drive would be to set the signal extraction sections in the same positional relationship in each pixel to an active tap at certain timing, for example.

For example, in the example illustrated in FIG. 4, it is a method in which the signal extraction section 111, the signal extraction section 113, and the signal extraction section 115 are set to an active tap at a certain timing, and the signal extraction section 112, the signal extraction section 114, and the signal extraction section 116 are set to an inactive tap.

However, in this case, a potential difference occurs between adjacent pixels. Therefore, mixing of signal (color mixture) is generated, and as a result the resolution of a distance image is reduced.

Specifically, for example, when attention is drawn to the pixel 101, in the aforementioned example, the signal extraction section 111 is an active tap and the signal extraction section 112 is an inactive tap. Therefore, a potential difference occurs between the signal extraction section 111 and the signal extraction section 112.

Thus, a current flows from the signal extraction section 111 to the signal extraction section 112, and an electron generated by the photoelectric conversion near the signal extraction section 112 is guided to the signal extraction section 111, and a charge corresponding to the electron is accumulated in the signal extraction section 111.

However, near the signal extraction section 112, which is an inactive tap, not only the signal extraction section 111, but also the signal extraction section 113, which is provided in the pixel 102 adjacent to the pixel 101, is present as an active tap. In particular, here, the distance from the signal extraction section 112 to the signal extraction section 111 and the distance from the signal extraction section 112 to the signal extraction section 113 are the same distance.

Thus, when the signal extraction section 113 is present near the signal extraction section 112, a potential difference also occurs between the signal extraction section 112 and the signal extraction section 113. Then, a current also flows from the signal extraction section 113 to the signal extraction section 112, and some of the electrons generated by the photoelectric conversion near the signal extraction section 112 are guided to the signal extraction section 113.

Originally, the electron generated by the photoelectric conversion in the pixel 101 should be collected by the signal extraction section 111 in the pixel 101. However, in this example, part of the electron generated in the pixel 101 is collected by the signal extraction section 113 of the adjacent pixel 102, resulting in generation of color mixture.

In particular, in this example, it is expected that the amount of color mixture is about 20 percent between pixels that are adjacent in the longitudinal direction in the drawing. Due to the generation of such color mixture, the resolution of a distance image only in the longitudinal direction is deteriorated.

Note that, at this time, in the pixel 103 adjacent to the pixel 101 in the right direction in the drawing, the signal extraction section 116 adjacent to the signal extraction section 112 of the pixel 101 is an inactive tap as with the signal extraction section 112. Therefore, the signal extraction section 112 and the signal extraction section 116 have the same potential, and color mixture is hardly generated between pixels that are adjacent right and left.

Meanwhile, according to the present technology, during drive of each pixel of the pixel array section 21, the inactive taps of each pixel and the active taps of pixels adjacent to the pixels are arranged in a distant state, thereby suppressing the generation of color mixture.

In other words, a pixel to which attention is drawn is called an attention pixel, and a pixel adjacent to the attention pixel in a direction in which two signal extraction sections in the attention pixel are aligned is referred to as an adjacent pixel.

At this time, assuming that the signal extraction section of the attention pixel on the adjacent pixel side is an inactive tap at certain timing, a signal extraction section of two signal extraction sections of the adjacent pixel on the attention pixel side is an inactive tap.

That is, pixel drive is performed such that the signal extraction section of the attention pixel on the adjacent pixel side and the signal extraction section of the adjacent pixel on the attention pixel side, which are adjacent to each other, always have the same potential (the same voltage is applied). In this case, it is sufficient that the two signal extraction sections having the same potential are connected to the same pixel drive line for applying a voltage to the application electrode as will be described later.

Specifically, in the example illustrated in FIG. 4, for example, the signal extraction section 111 of the pixel 101, the signal extraction section 114 of the pixel 102, and the signal extraction section 115 of the pixel 103 are an active tap at certain timing. Furthermore, for example, the signal extraction section 112 of the pixel 101, the signal extraction section 113 of the pixel 102, and the signal extraction section 116 of the pixel 103 are an inactive tap.

On the contrary, for example, the signal extraction section 111 of the pixel 101, the signal extraction section 114 of the pixel 102, and the signal extraction section 115 of the pixel 103 are an inactive tap at next timing. Furthermore, for example, the signal extraction section 112 of the pixel 101, the signal extraction section 113 of the pixel 102, and the signal extraction section 116 of the pixel 103 are an active tap.

In this case, for example, when the signal extraction section 112 is an inactive tap in the pixel 101, the signal extraction section 113 on the pixel 101 side in the pixel 102 adjacent to the pixel 101 on the signal extraction section 112 side is an inactive tap.

Therefore, the distance from the signal extraction section 112, which is an inactive tap, in the pixel 101 to the signal extraction section 111, which is an active tap, in the pixel 101 is L11. In contrast, the distance from the signal extraction section 112, which is an inactive tap, in the pixel 101 to the signal extraction section 114, which is an active tap, in the pixel 102 is L12.

Then, between the distance L11 and the distance L12, the relationship L11<L12 is established. That is, since the distance L11 is shorter than the distance L12, the signal extraction section 114 is arranged in a position farther than the position of the signal extraction section 111 when viewed from the signal extraction section 112.

In this case, similarly to the general pixel drive example described above, a potential difference occurs between the signal extraction section 111 and the signal extraction section 112 in the pixel 101, and a current flows from the signal extraction section 111 to the signal extraction section 112. Therefore, an electron generated by the photoelectric conversion near the signal extraction section 112 is guided to the signal extraction section 111, and a charge corresponding to the electron is accumulated in the signal extraction section 111.

Furthermore, in the pixel 102 adjacent to the pixel 101 on the side where the signal extraction section 112 is present, the signal extraction section 113 on the pixel 101 side has the same potential as the signal extraction section 112. That is, the signal extraction section 113 is an inactive tap as with the signal extraction section 112. Therefore, a current does not flow between the signal extraction section 113 and the signal extraction section 112.

The signal extraction section 114, which is an active tap, in the pixel 102 is sufficiently distant from the signal extraction section 112. Therefore, part of the electron generated by the photoelectric conversion near the signal extraction section 112 is hardly guided to the signal extraction section 114.

Thus, with the pixel drive method according to the present technology, it can be seen that the generation of color mixture between the pixel 101 and the pixel 102 can be suppressed.

Furthermore, also between the pixel 101 and the pixel 103, which is adjacent to the pixel 101 in a direction perpendicular to the direction in which the signal extraction sections in each pixel are aligned, the signal extraction section 112, which is an inactive tap, in the pixel 101 and the signal extraction section 115, which is an active tap, in the pixel 103 are arranged at a sufficient distance.

That is, when the distance from the signal extraction section 112 to the signal extraction section 115 is L13, the relationship L11<L13 is established. That is, the distance L11 is shorter than the distance L13. Furthermore, the signal extraction section 116 of the pixel 103, which is adjacent to the signal extraction section 112 in the pixel 101, has the same potential as the signal extraction section 112. From the above, color mixture is also hardly generated between the pixel 101 and the pixel 103.

As described above, when attention is drawn to the pixel 101, when the signal extraction section 112, which is an inactive tap, in the pixel 101, the signal extraction section 111, which is an inactive tap, in the pixel 101, and the signal extraction section 114, which is an active tap, in the pixel 102 are configured such that the relationship L11<L12 is established, the generation of color mixture can be suppressed.

In other words, regarding each pixel of the pixel array section 21, when pixel drive is performed such that adjacent signal extraction sections in adjacent pixels always have the same potential, the generation of color mixture can be suppressed. In this way, the deterioration of the resolution of a distance image can be suppressed, and distance measurement can be performed with higher accuracy.

Concerning Pixel Wiring

Furthermore, in order to drive each pixel as described with reference to FIG. 4, it is sufficient that a pixel drive line corresponding to the pixel drive line 28 illustrated in FIG. 1 is connected to an application electrode (injection contact section) of the signal extraction section, as illustrated, for example, in FIG. 5. Note that portions in FIG. 5 corresponding to those of FIG. 4 are designated by the same reference numerals, and description is omitted as appropriate.

Figure 5:
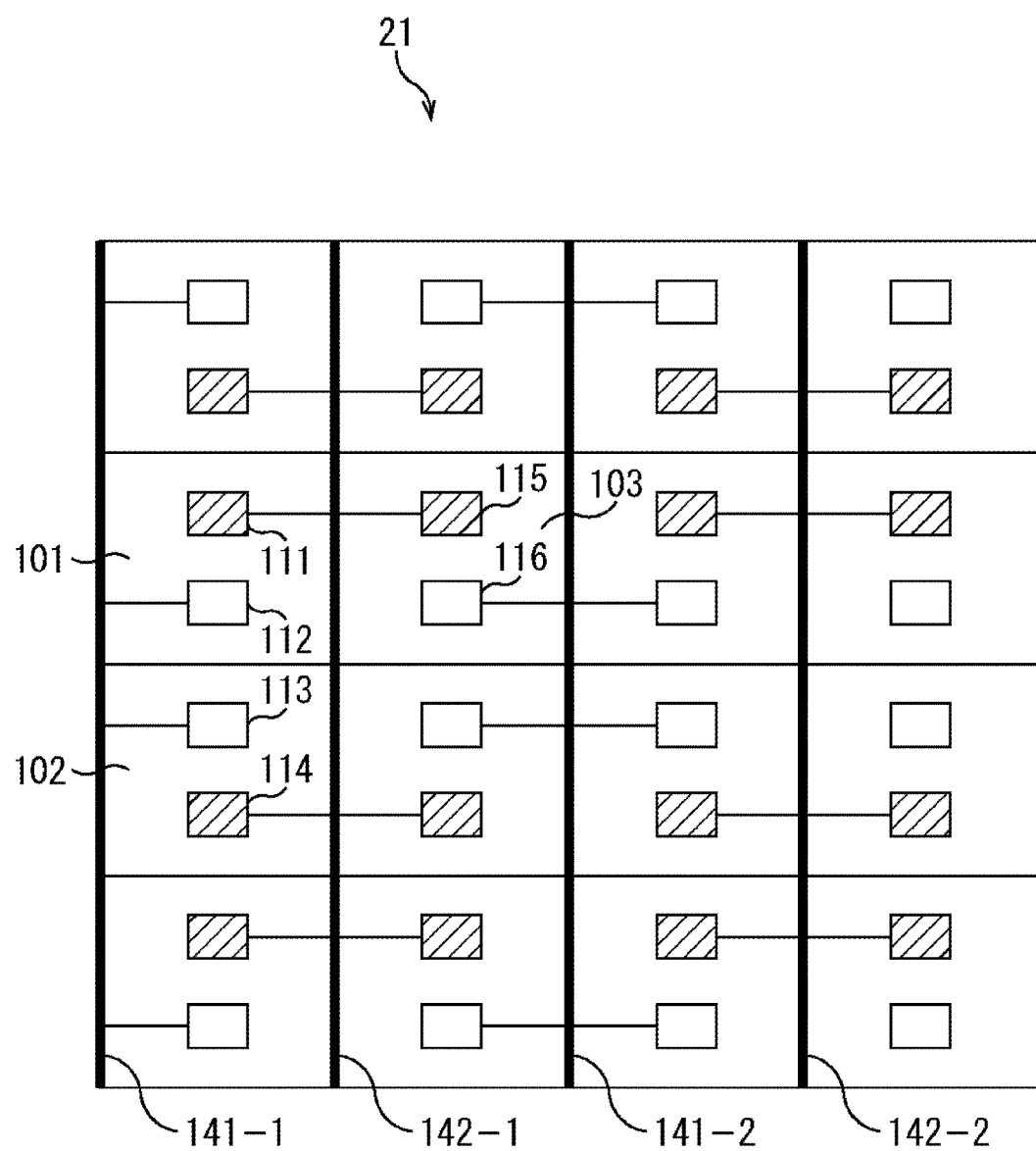
FIG. 5 is a diagram illustrating a wiring example of a pixel drive line connected to a signal extraction section.

In the example illustrated in FIG. 5, a pixel drive line 141-1, a pixel drive line 142-1, a pixel drive line 141-2, and a pixel drive line 142-2 are wired between adjacent pixel columns of the pixel array section 21 along the pixel column.

These pixel drive line 141-1, pixel drive line 142-1, pixel drive line 141-2, and pixel drive line 142-2 correspond to the pixel drive line 28 illustrated in FIG. 1.

For example, the pixel drive line 141-1 is wired on the left side of the pixel column including the pixel 101 and the pixel 102 in the drawing. The pixel drive line 141-1 is connected to application electrodes (injection contact sections) of the signal extraction sections, which become an inactive tap or active tap at the same timing, of the respective pixels of the pixel column including the pixel 101 and the pixel 102.

Specifically, for example, the P+ semiconductor region, which is an application electrode, corresponds to the P+ semiconductor region 73 of FIG. 2, and is provided on the signal extraction section 112 in the pixel 101, is connected to the pixel drive line 141-1. Similarly, the P+ semiconductor region, which is an application electrode, corresponds to the P+ semiconductor region 73 of FIG. 2, and is provided on the signal extraction section 113 in the pixel 102, is connected to the pixel drive line 141-1.

Furthermore, for example, the pixel drive line 142-1 is wired between the pixel column including the pixel 101 and the pixel 102 and the pixel column including the pixel 103. The pixel drive line 142-1 is connected to application electrodes (injection contact sections) of the signal extraction sections, which become an inactive tap or active tap at the same timing, of the respective pixels of the pixel column including the pixel 101 and the pixel 102 and the respective pixels of the pixel column including the pixel 103.

Specifically, for example, the P+ semiconductor region, which is an application electrode, corresponds to the P+ semiconductor region 73 of FIG. 2, and is provided on the signal extraction section 111 in the pixel 101, is connected to the pixel drive line 142-1.

Similarly, the P+ semiconductor region, which is an application electrode, corresponds to the P+ semiconductor region 73 of FIG. 2, and is provided on the signal extraction section 114 in the pixel 102, is connected to the pixel drive line 142-1. Moreover, the P+ semiconductor region, which is an application electrode, corresponds to the P+ semiconductor region 73 of FIG. 2, and is provided on the signal extraction section 115 in the pixel 103, is connected to the pixel drive line 142-1.

The pixel drive line 141-2 is wired between the pixel column including the pixel 103 and the pixel column provided on the right side of the pixel column including the pixel 103 in the drawing. The pixel drive line 141-2 is connected to application electrodes (injection contact sections) of the signal extraction sections, which become an inactive tap or active tap at the same timing, of the respective pixels of the pixel column including the pixel 103 and the respective pixels of the pixel column provided on the right side of the pixel column including the pixel 103 in the drawing.

Specifically, for example, the P+ semiconductor region, which is an application electrode, corresponds to the P+ semiconductor region 73 of FIG. 2, and is provided on the signal extraction section 116 in the pixel 103, is connected to the pixel drive line 141-2.

Moreover, the pixel drive line 142-2 is wired between the pixel column provided on the right side of the pixel column including the pixel 103 in the drawing and the pixel column provided on the right side of the pixel column in the drawing. The pixel drive line 142-2 is connected to application electrodes (injection contact sections) of the signal extraction sections, which become an inactive tap or active tap at the same timing, of the respective pixels of the pixel column provided on the right side of the pixel column including the pixel 103 in the drawing and the respective pixels of the pixel column provided on the right side of the pixel column in the drawing.

Note that the pixel drive line 141-1 and the pixel drive line 141-2 are simply referred to as the pixel drive line 141 below in a case where distinction is not particularly necessary. Furthermore, the pixel drive line 142-1 and the pixel drive line 142-2 are simply referred to as the pixel drive line 142 in a case where distinction not particularly necessary.

For example, in FIG. 2, the pixel drive line 141 and the pixel drive line 142 are formed in a wiring layer provided on a lower side of the substrate 61 illustrated in FIG. 2.

Here, the pixel drive line 141 and the pixel drive line 142 to which different voltages are applied at the same timing are alternately arranged relative to the pixel row direction.

In the example illustrated in FIG. 5, the pixel array section 21 includes the pixel, e.g., the pixel 101, in which the signal extraction section connected to the pixel drive line 141 is arranged on a lower side in the drawing, and the pixel, e.g., the pixel 102, in which the signal extraction section connected to the pixel drive line 141 is arranged on an upper side in the drawing.

Then, in the pixel array section 21, when viewed in the column direction in which the signal extraction sections are aligned in the pixel, the pixel whose arrangement of the signal extraction section is the same as the pixel 101 and the pixel whose arrangement of the signal extraction section is the same as the pixel 102 are alternately arranged in the column direction. Therefore, for example, when viewed in the column direction, the signal extraction sections connected to the pixel drive line 141 are arranged to be alternately aligned at the same pitch (length) as the distance L11 and at the same pitch (length) as the distance (L11+ L12).

Furthermore, in the pixel array section 21, when viewed in the row direction perpendicular to the column direction in which the signal extraction sections are aligned in the pixel, pixels whose arrangements of the signal extraction sections are the same are aligned. That is, when attention is drawn to one pixel column aligned in the row direction, in all the pixels constituting the pixel column, the arrangement of the signal extraction section is the same arrangement, and the signal extraction sections, which become an active tap or inactive tap at the same timing, are aligned in line in the row direction.

For example, the pixel drive section 22 applies a voltage to the pixel drive line 141 or the pixel drive line 142 such that the signal extraction section of each pixel becomes an active tap or inactive tap.

Specifically, for example, the pixel drive section 22 does not apply a voltage to the pixel drive line 141 at certain timing, i.e., applies a voltage of 0 V to the pixel drive line 141, but applies a positive voltage to the pixel drive line 142.

Thus, at the above timing, the signal extraction section 112 of the pixel 101, the signal extraction section 113 of the pixel 102, and the signal extraction section 116 of the pixel 103 are an inactive tap. Meanwhile, a positive voltage is applied to the application electrode (P+ semiconductor region) of the signal extraction section connected to the pixel drive line 142 via the pixel drive line 142. As a result, the signal extraction section 111 of the pixel 101, the signal extraction section 114 of the pixel 102, and the signal extraction section 115 of the pixel 103 are an active tap.

Furthermore, at next timing, the pixel drive section 22 does not apply a voltage to the pixel drive line 142, i.e., applies a voltage of 0 V to the pixel drive line 142, but applies a positive voltage to the pixel drive line 141.

Thus, at the above timing, the signal extraction section 112 of the pixel 101, the signal extraction section 113 of the pixel 102, and the signal extraction section 116 of the pixel 103 are an active tap. Meanwhile, the signal extraction section 111 of the pixel 101, the signal extraction section 114 of the pixel 102, and the signal extraction section 115 of the pixel 103 are an inactive tap.

As describe above, when the signal extraction sections to which the same voltage is to be applied at the same timing are connected to the same pixel drive line, it is possible to realize appropriate pixel drive easily. In addition, pixel wiring does not become troublesome or the cost does not increase.

As describe above, regarding each pixel of the pixel array section 21, when pixel drive is performed such that adjacent signal extraction sections in adjacent pixels always have the same potential, the generation of color mixture can be suppressed.

Second Embodiment

Regarding Configuration and Drive of the Pixel

Furthermore, although description is given of the example in which the signal extraction sections of all the pixels are arranged to be aligned in the column direction above, the arrangement of the signal extraction section in the pixel may be any arrangement.

Figure 6:
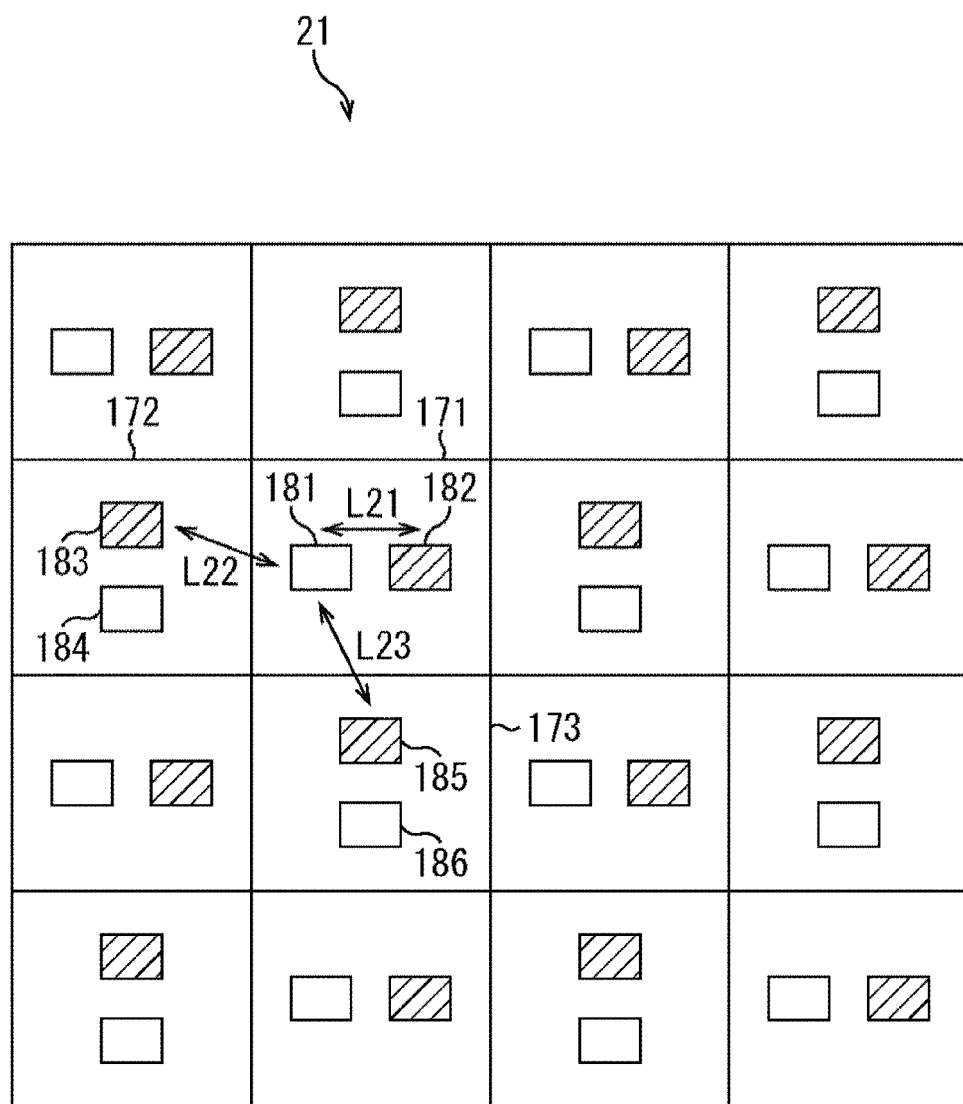
FIG. 6 is a diagram explaining arrangement of a signal extraction section in a pixel.

For example, as illustrated in FIG. 6, the pixel in which the signal extraction section is aligned in the column direction and the pixel in which the signal extraction section is aligned in the row direction may be arranged alternately in the row and column pattern in the pixel array section 21. Note that portions in FIG. 6 corresponding to those of FIG. 1 are designated by the same reference numerals, and description is omitted as appropriate.

In FIG. 6, respective rectangular shapes adjacently aligned correspond to pixels provided on the pixel array section 21, i.e., the pixel 51 illustrated in FIG. 2, and respective rectangular shapes in the pixels correspond to the signal extraction section 65.

In particular, a hatched rectangular shape in each pixel indicates a signal extraction section, which is an active tap at a predetermined timing, and an unhatched rectangular shape indicates a signal extraction section, which is an inactive tap at a predetermined timing.

Specifically, for example, each of a pixel 171 to a pixel 173 corresponds to the pixel 51 illustrated in FIG. 2, and the pixel 171 to the pixel 173 have a configuration similar to the configuration of the pixel 51.

In particular, the pixel 171 includes a signal extraction section 181 and a signal extraction section 182, which are aligned in the lateral direction, i.e., in the row direction, in the drawing.

Furthermore, the pixel 172 includes a signal extraction section 183 and a signal extraction section 184, which are aligned in the column direction, and the pixel 173 includes a signal extraction section 185 and a signal extraction section 186, which are aligned in the longitudinal direction, i.e., in the column direction, in the drawing.

The signal extraction section 181 to the signal extraction section 186 correspond to the signal extraction section 65 of the pixel 51.

In the pixel array section 21, the pixel, e.g., the pixel 171, in which two signal extraction sections are arranged to be aligned in the row direction and the pixel, e.g., the pixel 172 and the pixel 173, in which two signal extraction sections are arranged to be aligned in the column direction are alternately arranged in the row direction and the column direction.

Also in the case of such a pixel arrangement, the generation of color mixture can be suppressed similarly to the example illustrated in FIG. 4.

For example, a pixel to which attention is drawn is called an attention pixel, and a pixel adjacent to the attention pixel in a direction in which two signal extraction sections in the attention pixel are aligned is referred to as an adjacent pixel.

In this case, the distances from the signal extraction section of the attention pixel on the adjacent pixel side to each of the two signal extraction sections in the adjacent pixel are equal. However, the signal extraction section of the attention pixel on the adjacent pixel side and the signal extraction section in the adjacent pixel are arranged at a certain distance.

Therefore, also in the example illustrated in FIG. 6, compared to the case of the general pixel drive described above, the generation of color mixture can be suppressed.

Specifically, in the example illustrated in FIG. 6, for example, the signal extraction section 181 of the pixel 171, the signal extraction section 184 of the pixel 172, and the signal extraction section 186 of the pixel 173 are an inactive tap at certain timing. Furthermore, at this timing, the signal extraction section 182 of the pixel 171, the signal extraction section 183 of the pixel 172, and the signal extraction section 185 of the pixel 173 are an active tap.

On the contrary, for example, the signal extraction section 181 of the pixel 171, the signal extraction section 184 of the pixel 172, and the signal extraction section 186 of the pixel 173 are an active tap at next timing. Furthermore, at this timing, the signal extraction section 182 of the pixel 171, the signal extraction section 183 of the pixel 172, and the signal extraction section 185 of the pixel 173 are an inactive tap.

Here, the distance from the signal extraction section 181, which is an inactive tap, in the pixel 171 to the signal extraction section 182, which is an active tap, in the pixel 171 at the timing illustrated in FIG. 6 is L21.

Furthermore, the distance from the signal extraction section 181, which is an inactive tap, in the pixel 171 to the signal extraction section 183, which is an active tap, in the pixel 172 adjacent to the pixel 171 in the row direction at the timing illustrated in FIG. 6 is L22.

Similarly, the distance from the signal extraction section 181, which is an inactive tap, in the pixel 171 to the signal extraction section 185, which is an active tap, in the pixel 173 adjacent to the pixel 171 in the column direction at the timing illustrated in FIG. 6 is L23.

In this case, between the distance L21 and the distance L22, the relationship L21<L22 is established. That is, the distance L21 is shorter than the distance L22, and the signal extraction section 183 is arranged in a position farther than the position of the signal extraction section 182 when viewed from the signal extraction section 181. Similarly, between the distance L21 and the distance L23 also, the relationship L21<L23 is established.

Therefore, a large part of the electrons generated by the photoelectric conversion near the signal extraction section 181 are guided to the signal extraction section 182 in a state where, for example, the signal extraction section 181 is an inactive tap. In other words, few electrons are guided to the signal extraction section 183 or the signal extraction section 185.

Therefore, in the pixel arrangement illustrated in FIG. 6, the generation of color mixture can be suppressed between the pixel 171 and the pixel 172 or between the pixel 171 and the pixel 173. In this way, the deterioration of the resolution of a distance image can be suppressed, and distance measurement can be performed with higher accuracy.

In addition, in this example, the distance L22 from the signal extraction section 181 to the signal extraction section 183, the signal extraction sections being aligned in the row direction and the distance L23 from the signal extraction section 181 to the signal extraction section 185, which are aligned in the column direction, are the same (equal distance).

Therefore, even when color mixture is generated between the pixel 171 and the pixel 172 or between the pixel 171 and the pixel 173, the color mixture is substantially uniform in the row direction and the column direction. That is, anisotropy of color mixture, such as generation of color mixture of a distance image only in one direction like in the case of the general pixel drive described above, is not generated.

Note that, in the example illustrated in FIG. 6, description is given of an example in which at the timing when the signal extraction section 181 is an inactive tap, the signal extraction section 183 is an active tap and the signal extraction section 184 is an inactive tap. However, it is not limited to this, but the signal extraction section 183 may be an inactive tap and the signal extraction section 184 may be an active tap at the timing when the signal extraction section 181 is an inactive tap.

Furthermore, for example, at the timing when the signal extraction section 183 is an active tap and the signal extraction section 184 is an active tap, the signal extraction section 181 may be an active tap and the signal extraction section 182 may be an inactive tap.

Concerning Pixel Wiring

Furthermore, in order to drive each pixel as described with reference to FIG. 6, it is sufficient that a pixel drive line corresponding to the pixel drive line 28 illustrated in FIG. 1 is connected to an application electrode (injection contact section) of the signal extraction section, as illustrated, for example, in FIGS. 7 and 8. Note that portions in FIGS. 7 and 8 corresponding to those of FIG. 6 are designated by the same reference numerals, and description is omitted as appropriate.

Figure 7:
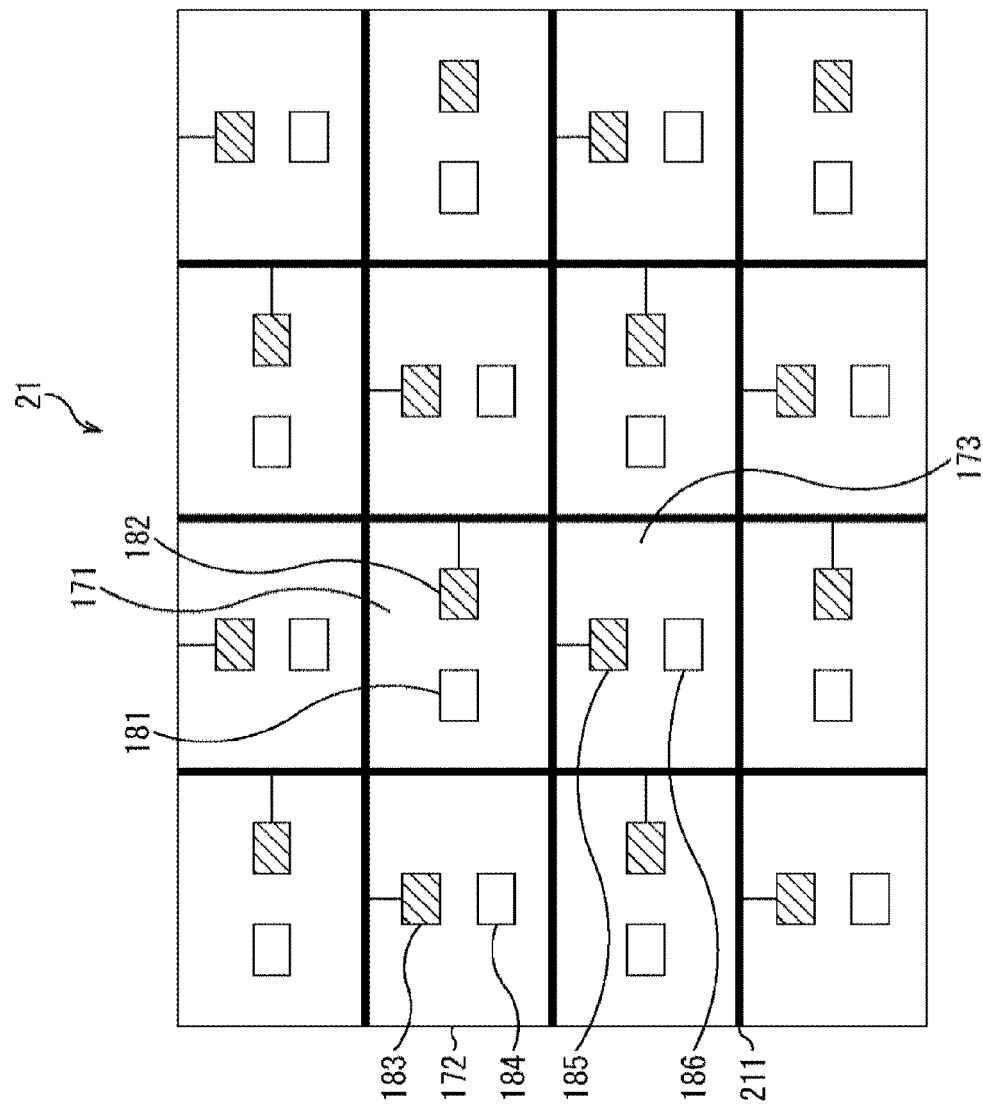
FIG. 7 is a diagram illustrating a wiring example of a pixel drive line connected to a signal extraction section.

FIG. 7 illustrates a wiring example of a pixel drive line 211 connected to the signal extraction sections, which are provided in the respective pixels of the pixel array section 21 including the pixel 171 to the pixel 173 illustrated in FIG. 6, and to which the same voltage is applied at the same timing.

The pixel drive line 211 includes a plurality of signal lines that is positioned between pixel columns, wired along the pixel columns, and long in the longitudinal direction in the drawing, and a plurality of signal lines that is positioned between pixel rows, wired along the pixel rows, and long in the lateral direction in the drawing.

Furthermore, the pixel drive line 211 is formed in a metal layer, which is a first layer constituting a wiring layer provided on, in FIG. 2, a lower side of the substrate 61 illustrated in FIG. 2, for example.

In this example, the P+ semiconductor region corresponding to the P+ semiconductor region 73 of FIG. 2, which is an application electrode (injection contact section) of the signal extraction section, which is an active tap at the timing illustrated in FIG. 6, e.g., the signal extraction section 182 in the pixel 171, the signal extraction section 183 in the pixel 172, and the signal extraction section 185 in the pixel 173, is connected to the pixel drive line 211.

Figure 8:
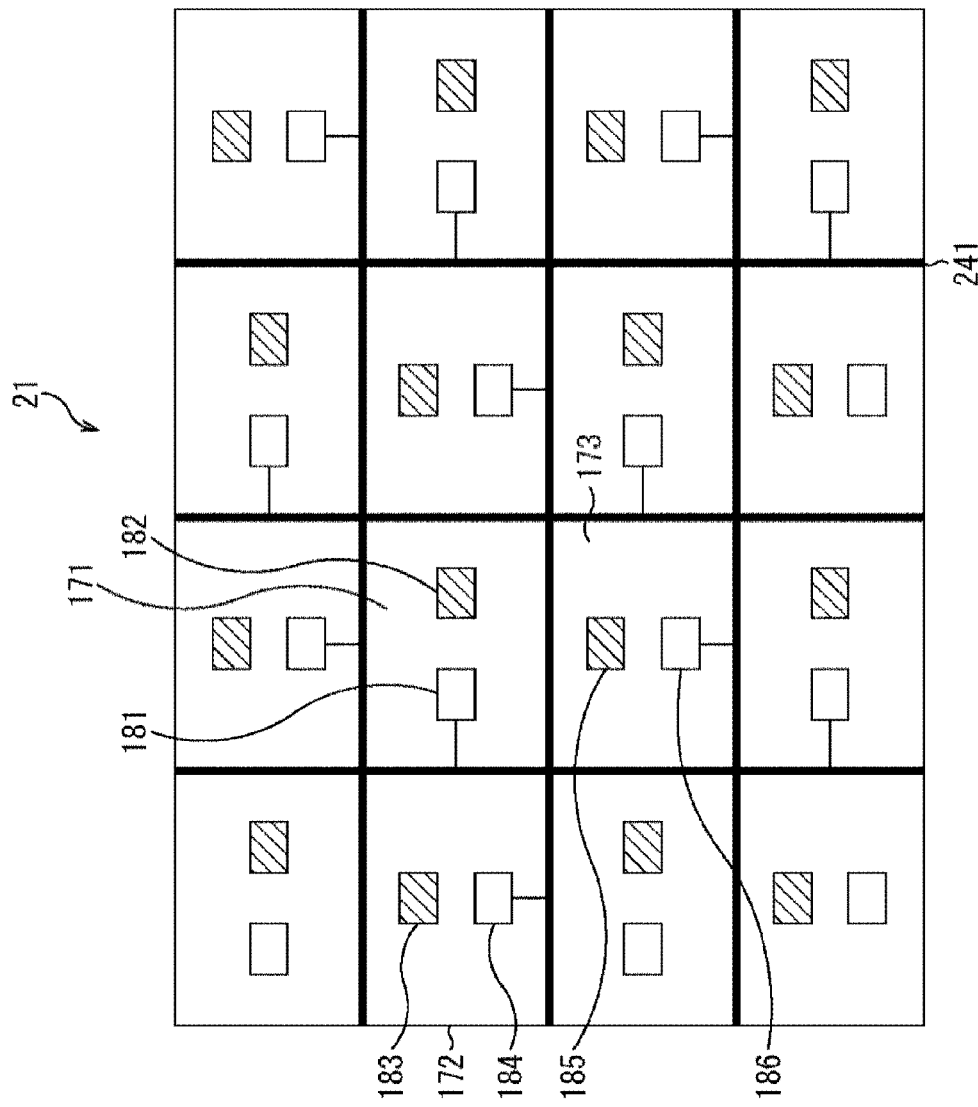
FIG. 8 is a diagram illustrating a wiring example of a pixel drive line connected to a signal extraction section.

Meanwhile, FIG. 8 illustrates a wiring example of a pixel drive line 241, which is different from the pixel drive line 211, connected to the signal extraction sections, which are provided in the respective pixels of the pixel array section 21 including the pixel 171 to the pixel 173 illustrated in FIG. 6, and to which the same voltage is applied at the same timing.

The pixel drive line 241 includes a plurality of signal lines that is positioned between pixel columns, wired along the pixel columns, and long in the longitudinal direction in the drawing, and a plurality of signal lines that is positioned between pixel rows, wired along the pixel rows, and long in the lateral direction in the drawing.

Furthermore, the pixel drive line 241 is formed in a metal layer, which is a second layer constituting a wiring layer provided on, in FIG. 2, a lower side of the substrate 61 illustrated in FIG. 2, for example.

In particular, both the pixel drive line 211 illustrated in FIG. 7 and the pixel drive line 241 illustrated in FIG. 8 are a single signal line obtained when a signal line long in the row direction and a signal line long in the column direction are connected. Therefore, the pixel drive line 211 and the pixel drive line 241 are formed on different layers.

In this example, the P+ semiconductor region corresponding to the P+ semiconductor region 73 of FIG. 2, which is an application electrode (injection contact section) of the signal extraction section, which is an inactive tap at the timing illustrated in FIG. 6, e.g., the signal extraction section 181 in the pixel 171, the signal extraction section 184 in the pixel 172, and the signal extraction section 186 in the pixel 173, is connected to the pixel drive line 241.

For example, the pixel drive section 22 applies a voltage to the pixel drive line 211 or the pixel drive line 241 to apply a voltage to the application electrode (P+ semiconductor region) of the signal extraction section of each pixel to generate an electric field such that the signal extraction section becomes an active tap or inactive tap.

Specifically, for example, the pixel drive section 22 does not apply a voltage to the pixel drive line 211 at certain timing, i.e., applies a voltage of 0 V to the pixel drive line 211, but applies a positive voltage to the pixel drive line 241.

Thus, at the above timing, the signal extraction section 181 of the pixel 171, the signal extraction section 184 of the pixel 172, and the signal extraction section 186 of the pixel 173 are an active tap. Meanwhile, the signal extraction section 182 of the pixel 171, the signal extraction section 183 of the pixel 172, and the signal extraction section 185 of the pixel 173 are an inactive tap.

Furthermore, at next timing, the pixel drive section 22 does not apply a voltage to the pixel drive line 241, i.e., applies a voltage of 0 V to the pixel drive line 241, but applies a positive voltage to the pixel drive line 211.

Thus, at the above timing, the signal extraction section 181 of the pixel 171, the signal extraction section 184 of the pixel 172, and the signal extraction section 186 of the pixel 173 are an inactive tap. Meanwhile, the signal extraction section 182 of the pixel 171, the signal extraction section 183 of the pixel 172, and the signal extraction section 185 of the pixel 173 are an active tap. That is, it becomes a state illustrated in FIG. 6.

As describe above, when the signal extraction sections to which the same voltage is to be applied at the same timing are connected to the same pixel drive line, it is possible to realize appropriate pixel drive easily. In addition, pixel wiring does not become troublesome or the cost does not increase.

Third Embodiment

Regarding Configuration and Drive of the Pixel

Moreover, in the pixel, signal extraction sections to which different voltages are applied at a predetermined timing may be arranged to be aligned in a diagonal direction in the pixel.

Figure 9:
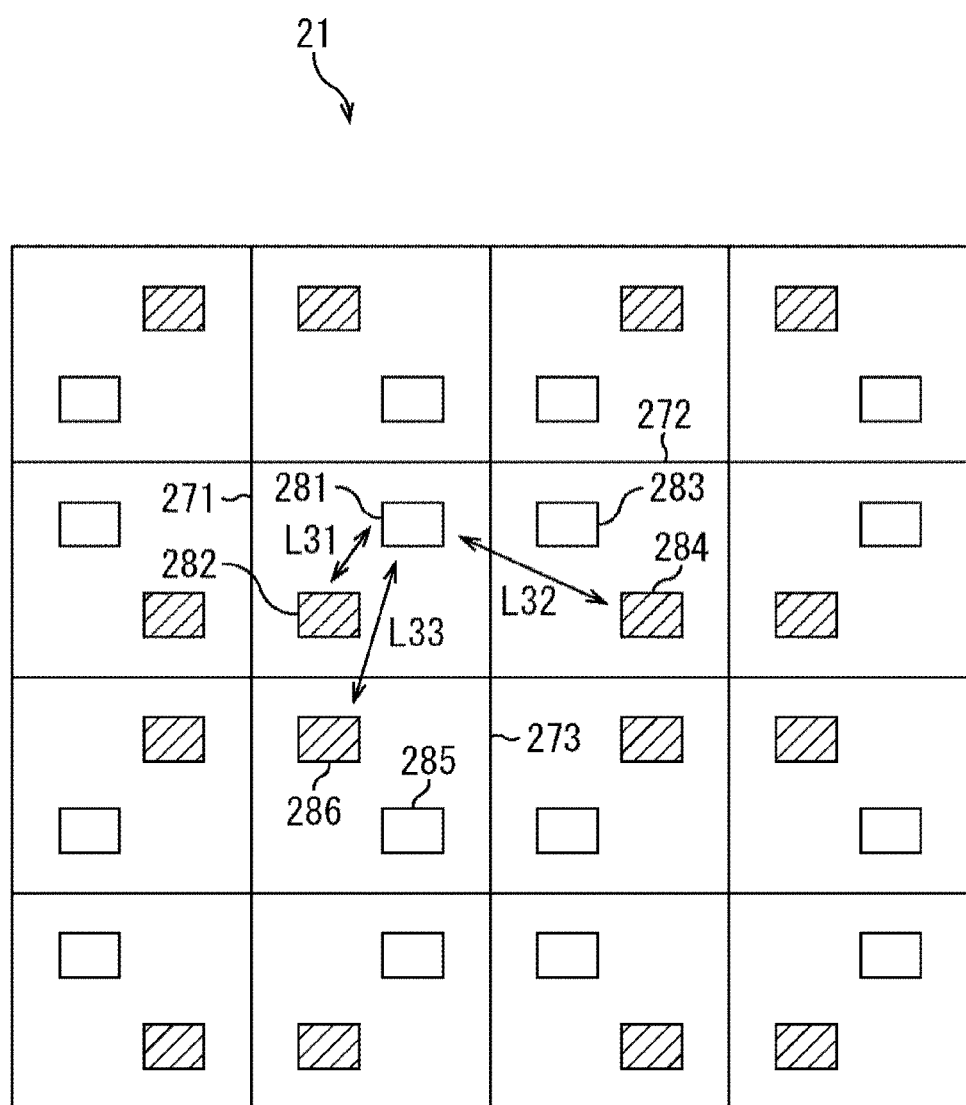
FIG. 9 is a diagram explaining arrangement of a signal extraction section in a pixel.

For example, as illustrated in FIG. 9, the pixel in which the signal extraction sections are aligned in the right diagonal direction in the drawing and the pixel in which the signal extraction sections are aligned in the left diagonal direction in the drawing may be arranged alternately in the row and column pattern in the pixel array section 21. Note that portions in FIG. 9 corresponding to those of FIG. 1 are designated by the same reference numerals, and description is omitted as appropriate.

In FIG. 9, respective rectangular shapes adjacently arranged correspond to pixels provided on the pixel array section 21, i.e., the pixel 51 illustrated in FIG. 2, and respective rectangular shapes in the pixels correspond to the signal extraction section 65.

In particular, a hatched rectangular shape in each pixel indicates a signal extraction section, which is an active tap at a predetermined timing, and an unhatched rectangular shape indicates a signal extraction section, which is an inactive tap at a predetermined timing.

Specifically, for example, each of a pixel 271 to a pixel 273 corresponds to the pixel 51 illustrated in FIG. 2, and the pixel 271 to the pixel 273 have a configuration similar to the configuration of the pixel 51.

However, here, in each pixel, signal extraction sections to which different voltages are applied at certain timing are arranged to be aligned in the diagonal direction of the pixel. In particular, the pixel 271 includes a signal extraction section 281 and a signal extraction section 282, which are aligned in the right diagonal direction in the drawing.

Furthermore, the pixel 272 adjacent to the pixel 271 in the row direction includes a signal extraction section 283 and a signal extraction section 284, which are aligned in the left diagonal direction in the drawing. The pixel 273 adjacent to the pixel 271 in the column direction includes a signal extraction section 285 and a signal extraction section 286, which are aligned in the left diagonal direction in the drawing.

The signal extraction section 281 to the signal extraction section 286 correspond to the signal extraction section 65 of the pixel 51.

In the pixel array section 21, in the row direction and the column direction, the pixel, e.g., the pixel 271, in which two signal extraction sections are arranged to be aligned in the right diagonal direction and the pixel, e.g., the pixel 272 and the pixel 273, in which two signal extraction sections are arranged to be aligned in a direction perpendicular to the right diagonal direction, i.e., in the left diagonal direction are alternately arranged in the row direction and the column direction.

Also in the case of such a pixel arrangement, the generation of color mixture can be suppressed similarly to the example illustrated in FIG. 4.

For example, a pixel to which attention is drawn is called an attention pixel, and one signal extraction section to which attention is drawn in the attention pixel is called an attention signal extraction section. Furthermore, a pixel adjacent to the attention pixel is referred to as an adjacent pixel.

In this case, the distance from the attention signal extraction section in the attention pixel to another signal extraction section is invariably shorter than the distance from the attention signal extraction section to a signal extraction section to which a different voltage is applied at the same timing as the attention signal extraction section in the adjacent pixel.

Therefore, also in the case illustrated in FIG. 9, compared to the case of the general pixel drive described above, the generation of color mixture can be suppressed.

In particular, here, the same voltage is applied at the same timing to the signal extraction section provided in the attention pixel on the adjacent pixel side, i.e., the signal extraction section of the attention pixel positioned closer to the adjacent pixel, and the signal extraction section in the adjacent pixel positioned closer to the attention pixel.

Specifically, in the example illustrated in FIG. 9, for example, the signal extraction section 281 of the pixel 271, the signal extraction section 283 of the pixel 272, and the signal extraction section 285 of the pixel 273 are an inactive tap at certain timing. Furthermore, at this timing, the signal extraction section 282 of the pixel 271, the signal extraction section 284 of the pixel 272, and the signal extraction section 286 of the pixel 273 are an active tap.

On the contrary, for example, the signal extraction section 281 of the pixel 271, the signal extraction section 283 of the pixel 272, and the signal extraction section 285 of the pixel 273 are an active tap at a next timing. Furthermore, at this timing, the signal extraction section 282 of the pixel 271, the signal extraction section 284 of the pixel 272, and the signal extraction section 286 of the pixel 273 are an inactive tap.

Here, the distance from the signal extraction section 281, which is an inactive tap, in the pixel 271 to the signal extraction section 282, which is an active tap, in the pixel 271 at the timing illustrated in FIG. 9 is L31.

Furthermore, the distance from the signal extraction section 281, which is an inactive tap, in the pixel 271 to the signal extraction section 284, which is an active tap, in the pixel 272 adjacent to the pixel 271 in the row direction at the timing illustrated in FIG. 9 is L32.

Similarly, the distance from the signal extraction section 281, which is an inactive tap, in the pixel 271 to the signal extraction section 286, which is an active tap, in the pixel 273 adjacent to the pixel 271 in the column direction at the timing illustrated in FIG. 9 is L33.

In this case, between the distance L31 and the distance L32, the relationship L31<L32 is established. That is, the distance L31 is shorter than the distance L32, and the signal extraction section 284 is arranged in a position farther than the position of the signal extraction section 282 when viewed from the signal extraction section 281. Similarly, between the distance L31 and the distance L33 also, the relationship L31<L33 is established.

Therefore, a large part of the electrons generated by the photoelectric conversion near the signal extraction section 281 are guided to the signal extraction section 282 in a state where, for example, the signal extraction section 281 is an inactive tap. In other words, few electrons are guided to the signal extraction section 284 or the signal extraction section 286.

Therefore, in the pixel arrangement illustrated in FIG. 9, the generation of color mixture can be suppressed between the pixel 271 and the pixel 272 or between the pixel 271 and the pixel 273. In this way, the deterioration of the resolution of a distance image can be suppressed, and distance measurement can be performed with higher accuracy.

In addition, in this example also, similarly to the example illustrated in FIG. 6, the distance L32 from the signal extraction section 281 to the signal extraction section 284 and the distance L33 from the signal extraction section 281 to the signal extraction section 286 are the same (equal distance). Therefore, a uniform distance image without anisotropy can be obtained.

Concerning Pixel Wiring

Furthermore, in order to drive each pixel as described with reference to FIG. 9, it is sufficient that a pixel drive line corresponding to the pixel drive line 28 illustrated in FIG. 1 is connected to an application electrode (injection contact section) of the signal extraction section, as illustrated, for example, in FIG. 10. Note that portions in FIG. 10 corresponding to those of FIG. 9 are designated by the same reference numerals, and description is omitted as appropriate.

Figure 10:
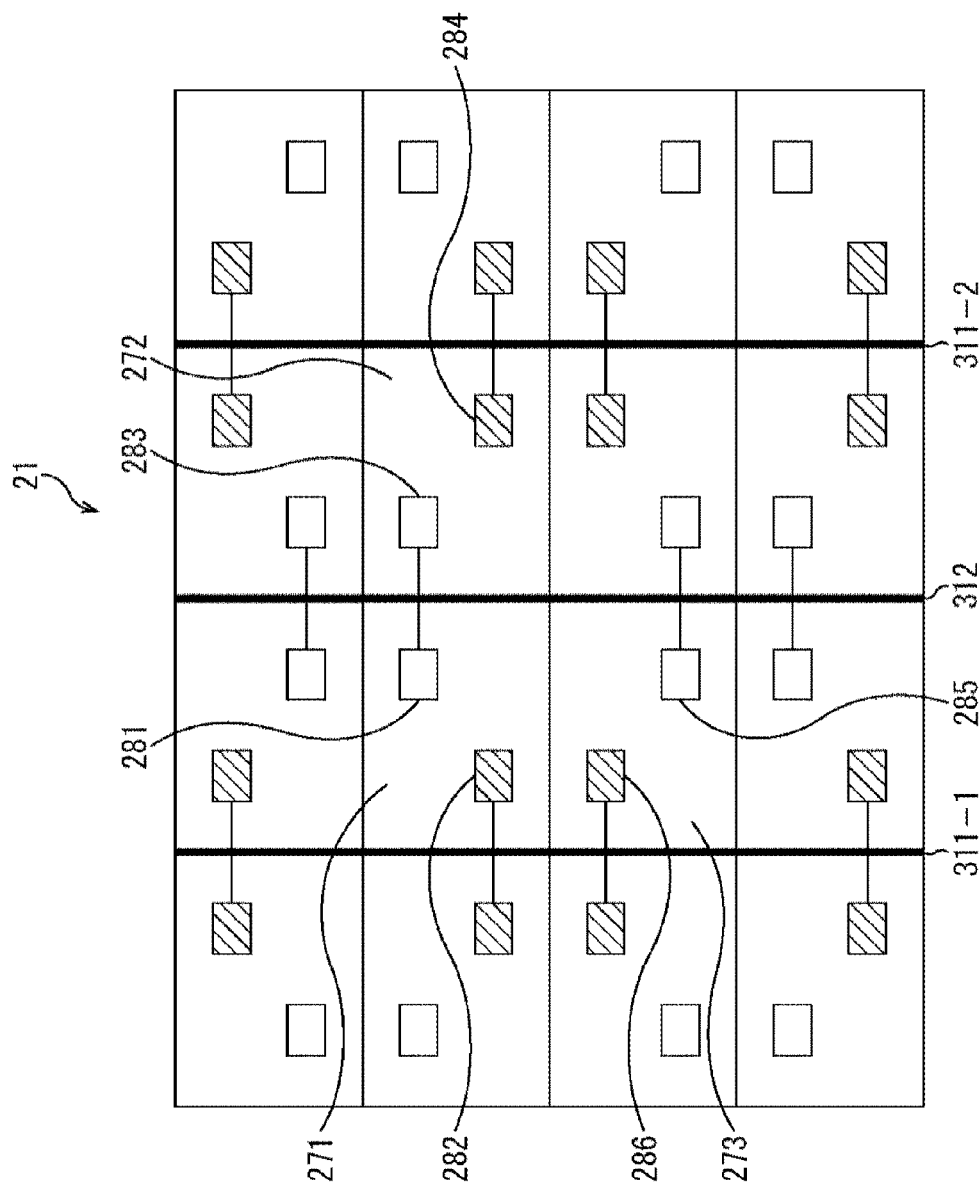
FIG. 10 is a diagram illustrating a wiring example of a pixel drive line connected to a signal extraction section.

In the example illustrated in FIG. 10, a pixel drive line 311-1, a pixel drive line 312, and a pixel drive line 311-2 are wired between adjacent pixel columns of the pixel array section 21 along the pixel column.

These pixel drive line 311 pixel drive line 312, and pixel drive line 311-2 correspond to the pixel drive line 28 illustrated in FIG. 1.

For example, the pixel drive line 311-1 is wired on the left side of the pixel column including the pixel 271 and the pixel 273 in the drawing. The pixel drive line 311-1 is connected to application electrodes (injection contact sections) of the signal extraction sections, which become an inactive tap or active tap at the same timing, of the respective pixels of the pixel column including the pixel 271 and the pixel 273.

Specifically, for example, the P+ semiconductor region, which is an application electrode, corresponds to the P+ semiconductor region 73 of FIG. 2, and is provided on the signal extraction section 282 in the pixel 271, is connected to the pixel drive line 311-1. Similarly, the P+ semiconductor region, which is an application electrode, corresponds to the P+ semiconductor region 73 of FIG. 2, and is provided on the signal extraction section 286 in the pixel 273, is connected to the pixel drive line 311-1.

Furthermore, for example, the pixel drive line 312 is wired between the pixel column including the pixel 271 and the pixel 273 and the pixel column including the pixel 272. The pixel drive line 312 is connected to application electrodes (injection contact sections) of the signal extraction sections, which become an inactive tap or active tap at the same timing, of the respective pixels of the pixel column including the pixel 271 and the pixel 273 and the respective pixels of the pixel column including the pixel 272.

Specifically, for example, the P+ semiconductor region, which is an application electrode, corresponds to the P+ semiconductor region 73 of FIG. 2, and is provided on the signal extraction section 281 in the pixel 271, is connected to the pixel drive line 312.

Similarly, the P+ semiconductor region, which is an application electrode, corresponds to the P+ semiconductor region 73 of FIG. 2, and is provided on the signal extraction section 285 in the pixel 273, is connected to the pixel drive line 312. Moreover, the P+ semiconductor region, which is an application electrode, corresponds to the P+ semiconductor region 73 of FIG. 2, and is provided on the signal extraction section 283 in the pixel 272, is connected to the pixel drive line 312.

The pixel drive line 311-2 is wired between the pixel column including the pixel 272 and the pixel column provided on the right side of the pixel column including the pixel 272 in the drawing. The pixel drive line 311-2 is connected to application electrodes (injection contact sections) of the signal extraction sections, which become an inactive tap or active tap at the same timing, of the respective pixels of the pixel column including the pixel 272 and the respective pixels of the pixel column provided on the right side of the pixel column including the pixel 272 in the drawing.

Specifically, for example, the P+ semiconductor region, which is an application electrode, corresponds to the P+ semiconductor region 73 of FIG. 2, and is provided on the signal extraction section 284 in the pixel 272, is connected to the pixel drive line 311-2.

Note that the pixel drive line 311-1 and the pixel drive line 311-2 are simply referred to as the pixel drive line 311 below in a case where distinction is not particularly necessary.

For example, the pixel drive line 311 and the pixel drive line 312 are formed in a wiring layer provided on a lower side, in FIG. 2, of the substrate 61 illustrated in FIG. 2.

Here, the pixel drive line 311 and the pixel drive line 312 to which different voltages are applied at the same timing are alternately arranged relative to the pixel row direction.

In other words, for example, the pixel drive section 22 applies a voltage to the pixel drive line 311 or the pixel drive line 312 such that the signal extraction section of each pixel becomes an active tap or inactive tap.

Specifically, for example, the pixel drive section 22 does not apply a voltage to the pixel drive line 311 at certain timing, i.e., applies a voltage of 0 V to the pixel drive line 311, but applies a positive voltage to the pixel drive line 312.

Thus, at the above timing, the signal extraction section 282 of the pixel 271, the signal extraction section 284 of the pixel 272, and the signal extraction section 286 of the pixel 273 are an inactive tap. Meanwhile, the signal extraction section 281 of the pixel 271, the signal extraction section 283 of the pixel 272, and the signal extraction section 285 of the pixel 273 are an active tap.

Furthermore, at a next timing, the pixel drive section 22 does not apply a voltage to the pixel drive line 312, i.e., applies a voltage of 0 V to the pixel drive line 312, but applies a positive voltage to the pixel drive line 311.

Thus, at the above timing, the signal extraction section 282 of the pixel 271, the signal extraction section 284 of the pixel 272, and the signal extraction section 286 of the pixel 273 are an active tap. Meanwhile, the signal extraction section 281 of the pixel 271, the signal extraction section 283 of the pixel 272, and the signal extraction section 285 of the pixel 273 are an inactive tap.

As describe above, when the signal extraction sections to which the same voltage is to be applied at the same timing are connected to the same pixel drive line, it is possible to realize appropriate pixel drive easily. In addition, pixel wiring does not become troublesome or the cost does not increase.

Fourth Embodiment

Regarding Configuration of the Pixel

Note that, above, description is given of the example in which two signal extraction sections are provided in each pixel of the pixel array section 21. However, three or more signal extraction sections may be provided in each pixel.

Figure 11:
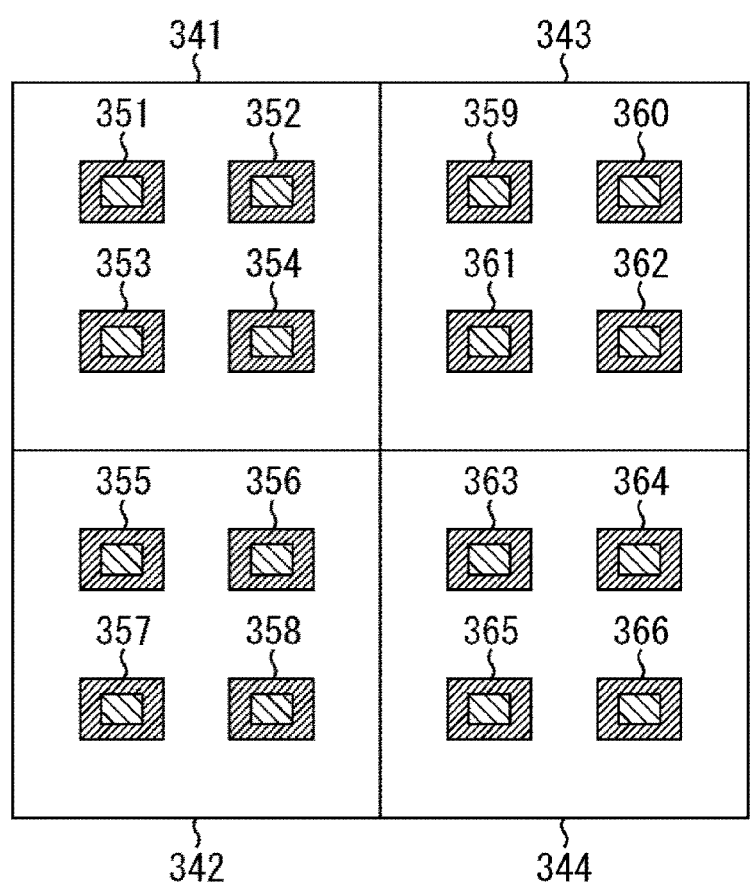
FIG. 11 is a diagram explaining arrangement of a signal extraction section in a pixel.

For example, in a case where four signal extraction sections are provided in each pixel in the pixel array section 21, the signal extraction sections are arranged in the pixel as illustrated in FIG. 11.

In other words, FIG. 11 illustrates a part of the pixel array section 21, i.e., four adjacent pixels 341 to 344 in the pixel array section 21.

In this example, in the pixel 341, four signal extraction sections 351 to 354 are provided.

Specifically, in the pixel 341, the signal extraction section 351 and the signal extraction section 354 are arranged to be aligned in the left diagonal direction in the pixel 341, and the signal extraction section 352 and the signal extraction section 353 are arranged to be aligned in the right diagonal direction in the pixel 341. That is, the signal extraction section 351 and the signal extraction section 354, and the signal extraction section 352 and the signal extraction section 353 are arranged to be aligned in diagonal directions, which are perpendicular to each other in the pixel 341.

Furthermore, the signal extraction section 351 to the signal extraction section 354 are arranged at equal distant positions from the center of the pixel 341.

Similarly, a signal extraction section 355 to a signal extraction section 358 are provided in the pixel 342 adjacent to the pixel 341 in the column direction, i.e., on a lower side in the drawing. Then, the arrangement of the signal extraction section 355 to the signal extraction section 358 in the pixel 342 is the same arrangement as the arrangement of the signal extraction section 351 to the signal extraction section 354.

Furthermore, a signal extraction section 359 to a signal extraction section 362 are provided in the pixel 343 adjacent to the pixel 341 in the row direction, i.e., on a right side in the drawing. The arrangement of the signal extraction section 359 to the signal extraction section 362 in the pixel 343 is the same arrangement as the arrangement of the signal extraction section 351 to the signal extraction section 354.

Moreover, a signal extraction section 363 to a signal extraction section 366 are provided in the pixel 344 adjacent to the pixel 341 on a lower right side in the drawing. The arrangement of the signal extraction section 363 to the signal extraction section 366 in the pixel 344 is the same arrangement as the arrangement of the signal extraction section 351 to the signal extraction section 354.

The signal extraction section 351 to the signal extraction section 366 illustrated in FIG. 11 correspond to the signal extraction section 65 of the pixel 51 illustrated in FIG. 2.

In a case where four signal extraction sections are provided in each pixel of the pixel array section 21 as described above, any one of the four signal extraction sections is an active tap and the other three signal extraction sections are an inactive tap at each timing. Furthermore, during pixel drive, the pixel is driven by the pixel drive section 22 such that the four signal extraction sections in the pixel become an active tap in sequence.

Concerning Pixel Wiring

Figure 12:
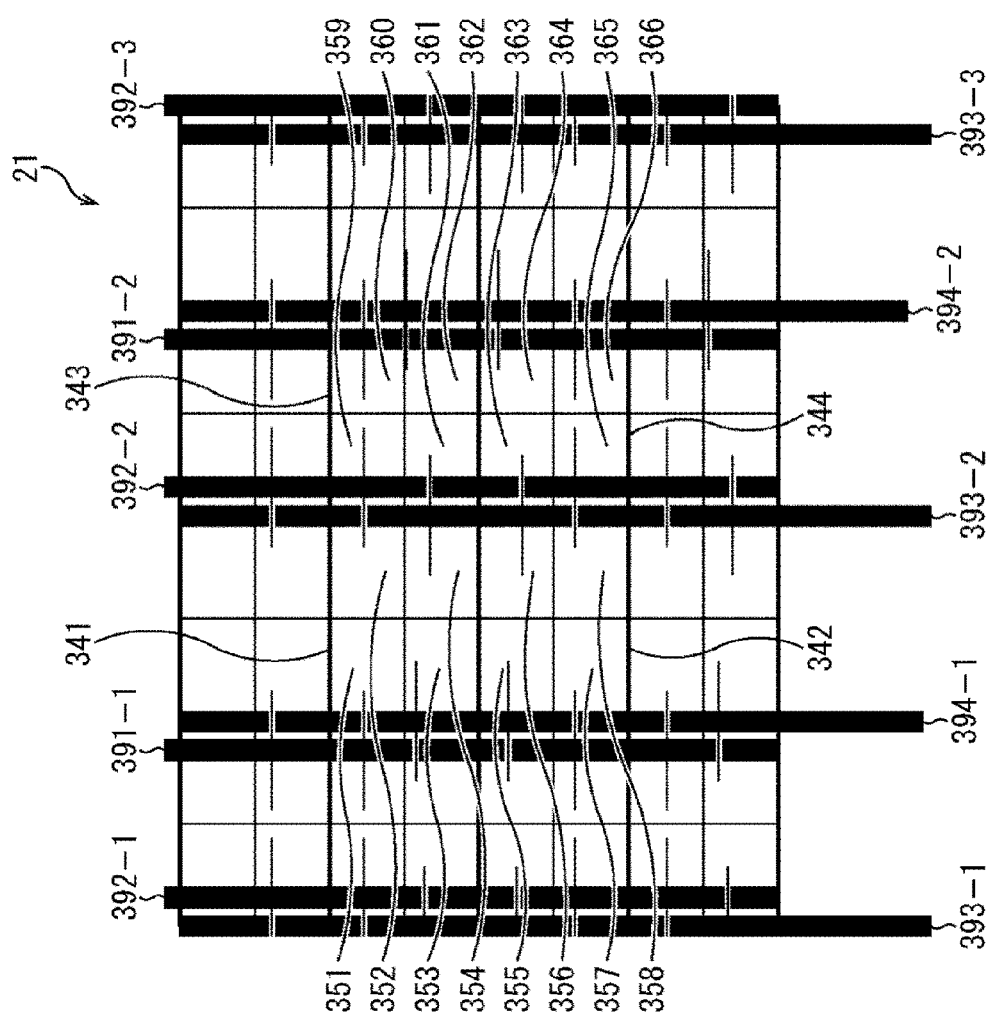
FIG. 12 is a diagram illustrating a wiring example of a pixel drive line connected to a signal extraction section.

In a case where four signal extraction sections are provided in each pixel as illustrated in FIG. 11, a wiring layout of a pixel drive line, which is connected to the application electrodes (injection contact sections) of the signal extraction sections and correspond to the pixel drive line 28 illustrated in FIG. 1 is as illustrated, for example, in FIG. 12. Note that portions in FIG. 12 corresponding to those of FIG. 11 are designated by the same reference numerals, and description is omitted as appropriate.

Note that, in FIG. 12, for the sake of clarity of the drawing, each pixel is divided into four regions, and each region is depicted as a signal extraction section. However, in more detail, in the pixel, as illustrated in FIG. 11, the four signal extraction sections are arranged to be distantly positioned at a predetermined distance with respect to one another.

In the example illustrated in FIG. 12, a pixel drive line 391-1, a pixel drive line 391-2, a pixel drive line 392-1, a pixel drive line 392-2, a pixel drive line 392-3, a pixel drive line 393-1, a pixel drive line 393-2, a pixel drive line 393-3, a pixel drive line 394-1, and a pixel drive line 394-2 are wired between adjacent pixel columns of the pixel array section 21 along the pixel column.

The pixel drive line 391-1, the pixel drive line 391-2, the pixel drive line 392-1, the pixel drive line 392-2, the pixel drive line 392-3, the pixel drive line 393-1, the pixel drive line 393-2, the pixel drive line 393-3, the pixel drive line 394-1, and the pixel drive line 394-2 correspond to the pixel drive line 28 illustrated in FIG. 1.

For example, the pixel drive line 391-1 is wired on the left side of the pixel column including the pixel 341 and the pixel 342 in the drawing. The pixel drive line 391-1 is connected to application electrodes (injection contact sections) of the signal extraction sections, which become an inactive tap or active tap at the same timing, of the respective pixels of the pixel column including the pixel 341 and the pixel 342.

Specifically, for example, the P+ semiconductor region, which is an application electrode, corresponds to the P+ semiconductor region 73 of FIG. 2, and is provided on the signal extraction section 351 in the pixel 341, is connected to the pixel drive line 391-1. Similarly, the P+ semiconductor region, which is an application electrode, corresponds to the P+ semiconductor region 73 of FIG. 2, and is provided on the signal extraction section 357 in the pixel 342, is connected to the pixel drive line 391-1.

Furthermore, the pixel drive line 391-2 is wired on the right side of the pixel column including the pixel 343 and the pixel 344 in the drawing. The pixel drive line 391-2 is connected to application electrodes (injection contact sections) of the signal extraction sections, which become an inactive tap or active tap at the same timing, of the respective pixels of the pixel column including the pixel 343 and the pixel 344.

Specifically, for example, the P+ semiconductor region, which is an application electrode, corresponds to the P+ semiconductor region 73 of FIG. 2, and is provided on the signal extraction section 360 in the pixel 343, is connected to the pixel drive line 391-2. Similarly, the P+ semiconductor region, which is an application electrode, corresponds to the P+ semiconductor region 73 of FIG. 2, and is provided on the signal extraction section 366 in the pixel 344, is connected to the pixel drive line 391-2.

The same voltage is applied to the pixel drive line 391-1 and the pixel drive line 391-2 at the same timing. Note that the pixel drive line 391-1 and the pixel drive line 391-2 are simply referred to as the pixel drive line 391 below in a case where distinction is not particularly necessary.

The pixel drive line 392-1 is connected to application electrodes (injection contact sections) of the signal extraction sections, which become an inactive tap or active tap at the same timing, of the respective pixels of the pixel column adjacent to the left side of the pixel column including the pixel 341 and the pixel 342 in the drawing.

Furthermore, the pixel drive line 392-2 is wired between the pixel column including the pixel 341 and the pixel 342 and the pixel column including the pixel 343 and the pixel 344. The pixel drive line 392-2 is connected to application electrodes (injection contact sections) of the signal extraction sections, which become an inactive tap or active tap at the same timing, of the respective pixels of the pixel column including the pixel 341 and the pixel 342 and the respective pixels of the pixel column including the pixel 343 and the pixel 344.

Specifically, for example, the P+ semiconductor region, which is an application electrode, corresponds to the P+ semiconductor region 73 of FIG. 2, and is provided on the signal extraction section 352 in the pixel 341, is connected to the pixel drive line 392-2. Similarly, the P+ semiconductor region, which is an application electrode, corresponds to the P+ semiconductor region 73 of FIG. 2, and is provided on the signal extraction section 358 in the pixel 342, is connected to the pixel drive line 392-2.

The P+ semiconductor region, which is an application electrode, corresponds to the P+ semiconductor region 73 of FIG. 2, and is provided on the signal extraction section 359 in the pixel 343, is connected to the pixel drive line 392-2. Furthermore, the P+ semiconductor region, which is an application electrode, corresponds to the P+ semiconductor region 73 of FIG. 2, and is provided on the signal extraction section 365 in the pixel 344, is connected to the pixel drive line 392-2.

The pixel drive line 392-3 is connected to application electrodes (injection contact sections) of the signal extraction sections, which become an inactive tap or active tap at the same timing, of the respective pixels of the pixel column adjacent to the right side, in the drawing, of the pixel column including the pixel 343 and the pixel 344.

The same voltage is applied to the pixel drive line 392-1 to the pixel drive line 392-3 at the same timing. Note that the pixel drive line 392-1 to the pixel drive line 392-3 are simply referred to as the pixel drive line 392 below in a case where distinction is not particularly necessary.

The pixel drive line 393-1 is connected to application electrodes (injection contact sections) of the signal extraction sections, which become an inactive tap or active tap at the same timing, of the respective pixels of the pixel column adjacent to the left side, in the drawing, of the pixel column including the pixel 341 and the pixel 342.

Furthermore, the pixel drive line 393-2 is wired between the pixel column including the pixel 341 and the pixel 342 and the pixel column including the pixel 343 and the pixel 344. The pixel drive line 393-2 is connected to application electrodes (injection contact sections) of the signal extraction sections, which become an inactive tap or active tap at the same timing, of the respective pixels of the pixel column including the pixel 341 and the pixel 342 and the respective pixels of the pixel column including the pixel 343 and the pixel 344.

Specifically, for example, the P+ semiconductor region, which is an application electrode, corresponds to the P+ semiconductor region 73 of FIG. 2, and is provided on the signal extraction section 354 in the pixel 341, is connected to the pixel drive line 393-2. Similarly, the P+ semiconductor region, which is an application electrode, corresponds to the P+ semiconductor region 73 of FIG. 2, and is provided on the signal extraction section 356 in the pixel 342, is connected to the pixel drive line 393-2.

The P+ semiconductor region, which is an application electrode, corresponds to the P+ semiconductor region 73 of FIG. 2, and is provided on the signal extraction section 361 in the pixel 343, is connected to the pixel drive line 393-2. Furthermore, the P+ semiconductor region, which is an application electrode, corresponds to the P+ semiconductor region 73 of FIG. 2, and is provided on the signal extraction section 363 in the pixel 344, is connected to the pixel drive line 393-2.

The pixel drive line 393-3 is connected to application electrodes (injection contact sections) of the signal extraction sections, which become an inactive tap or active tap at the same timing, of the respective pixels of the pixel column adjacent to the right side of the pixel column including the pixel 343 and the pixel 344 in the drawing.

The same voltage is applied to the pixel drive line 393-1 to the pixel drive line 393-3 at the same timing. Note that the pixel drive line 393-1 to the pixel drive line 393-3 are simply referred to as the pixel drive line 393 below in a case where distinction is not particularly necessary.

The pixel drive line 394-1 is wired on the left side of the pixel column including the pixel 341 and the pixel 342 in the drawing. The pixel drive line 394-1 is connected to application electrodes (injection contact sections) of the signal extraction sections, which become an inactive tap or active tap at the same timing, of the respective pixels of the pixel column including the pixel 341 and the pixel 342.

Specifically, for example, the P+ semiconductor region, which is an application electrode, corresponds to the P+ semiconductor region 73 of FIG. 2, and is provided on the signal extraction section 353 in the pixel 341, is connected to the pixel drive line 394-1. Similarly, the P+ semiconductor region, which is an application electrode, corresponds to the P+ semiconductor region 73 of FIG. 2, and is provided on the signal extraction section 355 in the pixel 342, is connected to the pixel drive line 394-1.

Furthermore, the pixel drive line 394-2 is wired on the right side of the pixel column including the pixel 343 and the pixel 344 in the drawing. The pixel drive line 394-2 is connected to application electrodes (injection contact sections) of the signal extraction sections, which become an inactive tap or active tap at the same timing, of the respective pixels of the pixel column including the pixel 343 and the pixel 344.

Specifically, for example, the P+ semiconductor region, which is an application electrode, corresponds to the P+ semiconductor region 73 of FIG. 2, and is provided on the signal extraction section 362 in the pixel 343, is connected to the pixel drive line 394-2. Similarly, the P+ semiconductor region, which is an application electrode, corresponds to the P+ semiconductor region 73 of FIG. 2, and is provided on the signal extraction section 364 in the pixel 344, is connected to the pixel drive line 394-2.

The same voltage is applied to the pixel drive line 394-1 and the pixel drive line 394-2 at the same timing. Note that the pixel drive line 394-1 and the pixel drive line 394-2 are simply referred to as the pixel drive line 394 below in a case where distinction is not particularly necessary.

In a case where four signal extraction sections are provided in one pixel as described above, two pixel drive wires are provided between two adjacent pixel columns. For example, in the example illustrated in FIG. 12, the pixel drive line 391-1 and the pixel drive line 394-1 are wired at the same position when viewed from a direction perpendicular to the plane of the pixel array section 21.

Thus, in the pixel array section 21, the pixel drive line 391 and the pixel drive line 392 are formed in a metal layer, which is a first layer constituting a wiring layer provided on, in FIG. 2, a lower side of the substrate 61 illustrated in FIG. 2, for example. Furthermore, the pixel drive line 393 and the pixel drive line 394 are formed in a metal layer, which is a second layer constituting a wiring layer provided on, in FIG. 2, a lower side of the substrate 61 illustrated in FIG. 2, for example.

Regarding Drive of the Pixel

Figure 13:
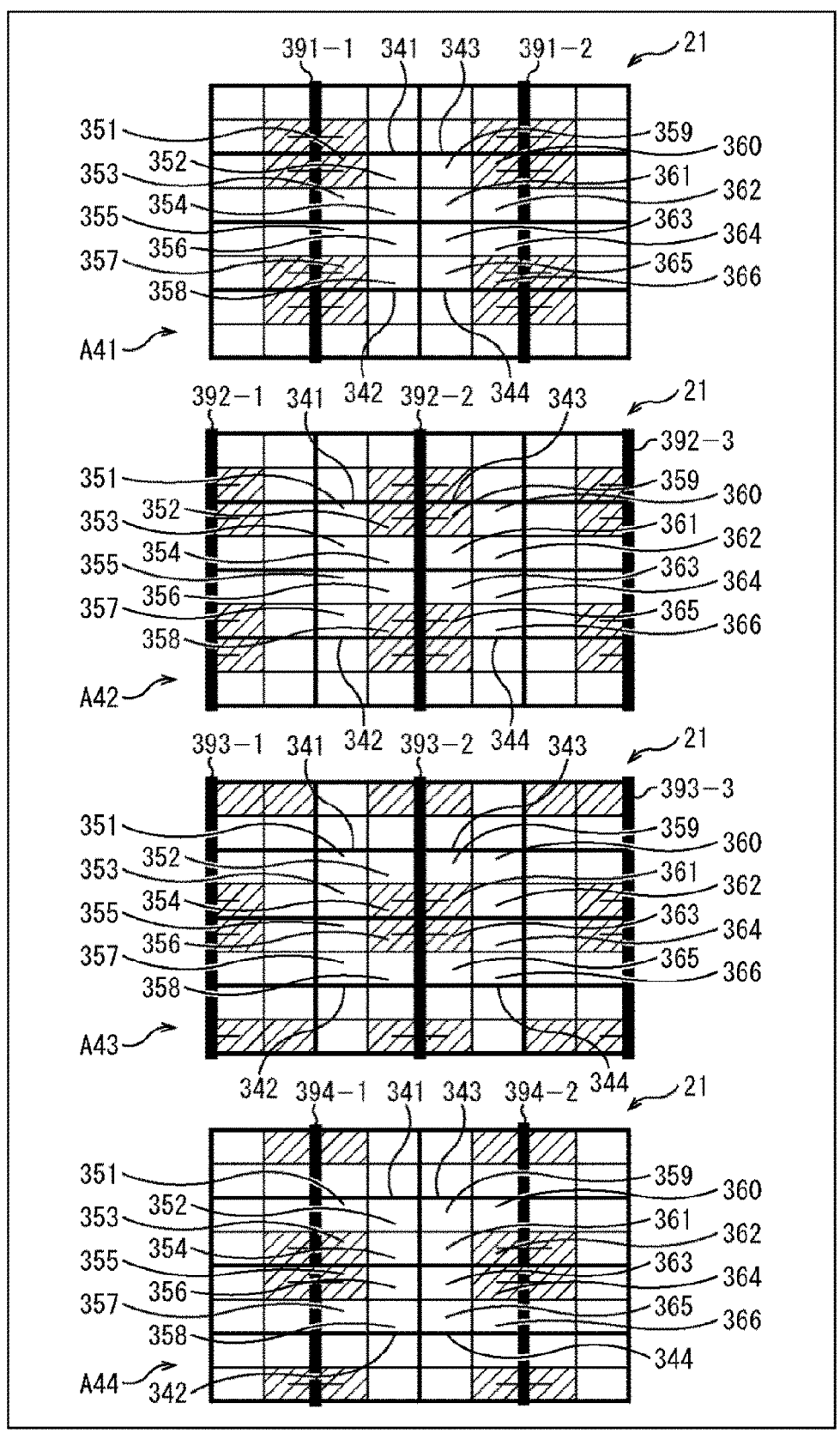
FIG. 13 is a diagram explaining a drive example of a pixel.

In a case where the pixel drive line is wired as illustrated in FIG. 12 above, for example, the pixel drive section 22 drives each pixel of the pixel array section 21 as illustrated in FIG. 13. Note that portions in FIG. 13 corresponding to those of FIG. 12 are designated by the same reference numerals, and description is omitted as appropriate.

Furthermore, in FIG. 13, similarly to the case of FIG. 12, for the sake of clarity of the drawing, each pixel is divided into four regions, and each region is depicted as a signal extraction section.

For example, the pixel drive section 22 does not apply a voltage to the pixel drive line 392 to the pixel drive line 394 at a certain timing as indicated by arrow A41, i.e., applies a voltage of 0 V to the pixel drive line 392 to the pixel drive line 394, but applies a positive voltage to the pixel drive line 391.

Thus, in the pixel 341, the signal extraction section 351 is an active tap, and the other three signal extraction sections other than the signal extraction section 351 of the pixel 341 are an inactive tap. Note that the signal extraction sections with hatching in FIG. 13 indicate a signal extraction section in an active tap state.

Similarly, in the pixel 342, the signal extraction section 357 is an active tap, and the other three signal extraction sections other than the signal extraction section 357 of the pixel 342 are an inactive tap. In the pixel 343, the signal extraction section 360 is an active tap, and the other three signal extraction sections other than the signal extraction section 360 of the pixel 343 are an inactive tap.

In the pixel 344, the signal extraction section 366 is an active tap, and the other three signal extraction sections other than the signal extraction section 366 of the pixel 344 are an inactive tap.

Furthermore, the pixel drive section 22 applies a voltage of 0 V to the pixel drive line 391, the pixel drive line 393, and the pixel drive line 394 as indicated by arrow A42 and applies a positive voltage to the pixel drive line 392 at next timing after the timing indicated by arrow A41.

Thus, the signal extraction section 352 is an only active tap in the pixel 341, and the signal extraction section 358 is an only active tap in the pixel 342.

The signal extraction section 359 is an only active tap in the pixel 343, and the signal extraction section 365 is an only active tap in the pixel 344.

At next timing after the timing indicated by arrow A42, the pixel drive section 22 applies a voltage of 0 V to the pixel drive line 391, the pixel drive line 392, and the pixel drive line 394 as indicated by arrow A43 and applies a positive voltage to the pixel drive line 393.

Thus, the signal extraction section 354 is an only active tap in the pixel 341, and the signal extraction section 356 is an only active tap in the pixel 342.

The signal extraction section 361 is an only active tap in the pixel 343, and the signal extraction section 363 is an only active tap in the pixel 344.

Moreover, at next timing after the timing indicated by arrow A43, the pixel drive section 22 applies a voltage of 0 V to the pixel drive line 391 to the pixel drive line 393 as indicated by arrow A44 and applies a positive voltage to the pixel drive line 394.

Thus, the signal extraction section 353 is an only active tap in the pixel 341, and the signal extraction section 355 is an only active tap in the pixel 342.

The signal extraction section 362 is an only active tap in the pixel 343, and the signal extraction section 364 is an only active tap in the pixel 344.

When the pixel drive described above is performed, the signal extraction sections in positions closest to the adjacent pixel in each of four adjacent pixels become an active tap.

Specifically, one pixel is called an attention pixel, and a signal extraction section, which is an active tap of the attention pixel at certain timing, is referred to as an attention signal extraction section. Furthermore, each of three adjacent pixels on the attention signal extraction section side when viewed from the attention pixel is called an adjacent pixel. At this time, in each adjacent pixel, among the four signal extraction sections, the signal extraction section in a position closest to the attention signal extraction section is an active tap.

Furthermore, at this time, the distance relationship similar to that the cases of the first embodiment to the third embodiment described above is established.

In other words, for example, the distance from any signal extraction section, which is an inactive tap in the attention pixel, to the attention signal extraction section, which is an active tap in the attention pixel is L41. Furthermore, the distance from any signal extraction section, which is an inactive tap in the attention pixel, to the signal extraction section, which is an active tap in the pixel adjacent to the attention pixel is L42.

At this time, at any timing, the relationship L41<L42 is invariably established and the generation of color mixture is suppressed. In this way, the deterioration of the resolution of a distance image can be suppressed, and distance measurement can be performed with higher accuracy.

For example, at the timing indicated by arrow A43, assuming that the pixel 341 is an attention pixel, the signal extraction section 354, which is an active tap, is an attention signal extraction section.

Furthermore, the pixels adjacent to the pixel 341, which is an attention pixel, on the signal extraction section 354 side, i.e., the pixels, which are adjacent pixels, are the pixel 342 to the pixel 344.

At this time, the signal extraction section, which is an active tap in the pixel 342, is the signal extraction section 356 in a position closest to the signal extraction section 354, which is an attention signal extraction section. Similarly, the signal extraction section, which is an active tap in the pixel 343, is the signal extraction section 361 in a position closest to the signal extraction section 354, and the signal extraction section, which is an active tap in the pixel 344, is the signal extraction section 363 in a position closest to the signal extraction section 354.

Furthermore, for example, at the timing indicated by arrow A41, the pixel 341 is an attention pixel, and attention is drawn to the signal extraction section 354, which is an inactive tap in the pixel 341.

In this case, the distance from the signal extraction section 354 to the signal extraction section 351, which is an active tap in the same attention pixel, is distance L41.

Moreover, for example, the distance from the signal extraction section 357, which is an active tap in the pixel 342 adjacent to the pixel 341, which is an attention pixel, to the signal extraction section 354 to which attention is drawn, is distance L42.

Thus, in this case, the relationship L41<L42 is established. That is, the signal extraction section 357 is arranged in a position farther than the signal extraction section 351 when viewed from the signal extraction section 354.

As described above, even in a case where three or more signal extraction sections are provided in a pixel of the pixel array section 21, color mixture can be suppressed.

Example of Application to Electronic Equipment

Moreover, for example, the aforementioned solid-state imaging element 11 can be applied to various types of electronic equipment including an imaging apparatus, e.g., a digital still camera or a digital video camera, a mobile phone with an imaging function, and other equipment with an imaging function.

Figure 14:
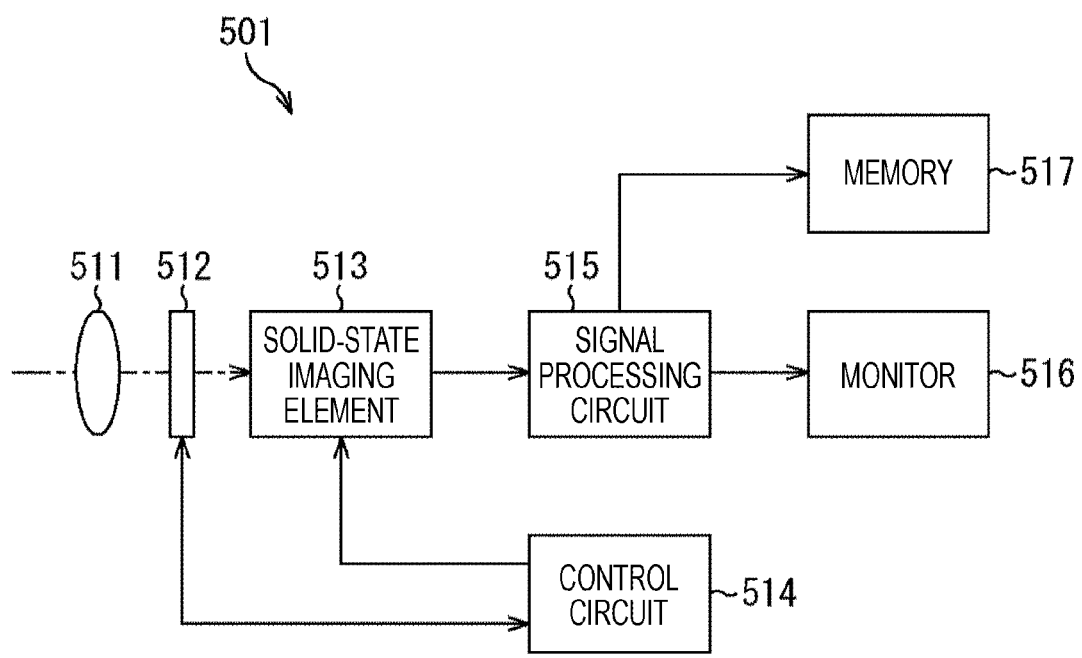
FIG. 14 is a diagram illustrating a configuration example of an imaging apparatus.

FIG. 14 is a block diagram illustrating a configuration example of an imaging apparatus, which is electronic equipment to which the present technology has been applied.

An imaging apparatus 501 illustrated in FIG. 14 includes an optical system 511, a shutter device 512, a solid-state imaging element 513, a control circuit 514, a signal processing circuit 515, a monitor 516, and a memory 517, and can image a steel image and a video.

The optical system 511 includes one or a plurality of lenses and guides light (incident light) from the object to the solid-state imaging element 513 to form an image on the light receiving surface of the solid-state imaging element 513.

The shutter device 512 is arranged between the optical system 511 and the solid-state imaging element 513 and controls a light emission period and a light shielding period with respect to the solid-state imaging element 513 according to control by the control circuit 514.

The solid-state imaging element 513 accumulates a signal charge over a certain period of time depending on the light that forms an image on the light receiving surface via the optical system 511 and the shutter device 512. The signal charge accumulated on the solid-state imaging element 513 is transferred according to a drive signal (timing signal) fed from the control circuit 514.

The control circuit 514 outputs a drive signal that controls the transfer operation of the solid-state imaging element 513 and the shutter operation of the shutter device 512, and drives the solid-state imaging element 513 and the shutter device 512.

The signal processing circuit 515 performs various types of signal processing on the signal charge output from the solid-state imaging element 513. The image (image data) obtained when the signal processing circuit 515 performs signal processing is fed to and displayed on the monitor 516 or fed to and recorded on the memory 517.

The present technology can also be applied to the imaging apparatus 501 configured in the manner described above. In other words, for example, the solid-state imaging element 513 corresponds to the aforementioned solid-state imaging element 11.

Note that the embodiment of the present technology is not limited to the aforementioned embodiments, but various changes may be made within the scope not departing from the gist of the present technology.

Furthermore, the effects described in the present description are merely illustrative and are not limitative, and other effects may be provided.

Moreover, the present technology may be configured as below.

(1)

An imaging element including:

a pixel array section including a plurality of pixels that photoelectrically converts incident light;

the pixel including a first signal extraction section including an application electrode connected to a first drive line for application of voltage, for generating an electric field by the application of the voltage, and a suction electrode for detecting a signal carrier generated by the photoelectric conversion, and a second signal extraction section including an application electrode connected to a second drive line for application of voltage and the suction electrode, in which a distance from the first signal extraction section of the predetermined pixel to the second signal extraction section of the predetermined pixel is shorter than a distance from the first signal extraction section of the predetermined pixel to the second signal extraction section of another pixel adjacent to the predetermined pixel.

(2)

The imaging element according to (1), in which in the pixel, the first signal extraction section and the second signal extraction section are arranged to be aligned in a first direction, and in the other pixel adjacent to the predetermined pixel on the first signal extraction section side of the predetermined pixel in the first direction, the first signal extraction section is arranged to be positioned on the predetermined pixel side relative to the second signal extraction section.

(3)

The imaging element according to (2), in which the pixel in which arrangement of the first signal extraction section and the second signal extraction section is same as the predetermined pixel and the pixel in which arrangement of the first signal extraction section and the second signal extraction section is same as the other pixel are alternately arranged in the first direction.

(4)

The imaging element according to (2) or (3), in which arrangement of the first signal extraction section and the second signal extraction section is same in all of the pixels aligned in a second direction perpendicular to the first direction.

(5)

The imaging element according to (1), in which the pixel in which the first signal extraction section and the second signal extraction section are arranged to be aligned in a first direction and the pixel in which the first signal extraction section and the second signal extraction section are arranged to be aligned in a second direction perpendicular to the first direction are alternately arranged in the first direction and the second direction.

(6)

The imaging element according to (1), in which the pixel in which the first signal extraction section and the second signal extraction section are arranged to be aligned in a first diagonal direction and the pixel in which the first signal extraction section and the second signal extraction section are arranged to be aligned in a second diagonal direction perpendicular to the first diagonal direction are alternately arranged.

(7)

The imaging element according to (6), in which in the other pixel adjacent to the predetermined pixel on the first signal extraction section side of the predetermined pixel, the first signal extraction section is arranged to be positioned on the predetermined pixel side relative to the second signal extraction section.

(8)

The imaging element according to (1), in which the pixel includes three or more signal extraction sections including the first signal extraction section and the second signal extraction section.

(9)

An imaging apparatus including:

a pixel array section including a plurality of pixels that photoelectrically converts incident light;

the pixel including a first signal extraction section including an application electrode connected to a first drive line for application of voltage, for generating an electric field by the application of the voltage, and a suction electrode for detecting a signal carrier generated by the photoelectric conversion, and a second signal extraction section including an application electrode connected to a second drive line for application of voltage and the suction electrode, in which a distance from the first signal extraction section of the predetermined pixel to the second signal extraction section of the predetermined pixel is shorter than a distance from the first signal extraction section of the predetermined pixel to the second signal extraction section of another pixel adjacent to the predetermined pixel.

REFERENCE SIGNS LIST

11 Solid-state imaging element
21 Pixel array section
22 Pixel drive section
51 Pixel
61 Substrate
65-1, 65-2, 65 Signal extraction section
71-1, 71-2, 71 N+ semiconductor region
73-1, 73-2, 73 P+ semiconductor region

The invention claimed is:

1. A light detecting element, comprising:
a pixel array section including a first pixel and a second pixel adjacent each other in a first direction, wherein each of the first and second pixels generates charge corresponding to an amount of received light;
a first pixel drive line extending along the first direction; and
a second pixel drive line extending along the first direction,
wherein
the first pixel includes a first tap and a second tap adjacent each other in the first direction,
the second pixel includes a third tap and a fourth tap adjacent each other in the first direction,
the first tap, the second tap, the third tap, and the fourth tap are arranged along the first direction in this order,
the first pixel drive line is connected to the first tap and the fourth tap,
the second pixel drive line is connected to the second tap and the third tap,
the first pixel receives incident light via a first on-chip lens, and
the second pixel receives incident light via a second on-chip lens.

2. The light detecting element of claim 1, wherein at least the first pixel generates charge in response to receiving infrared light.

3. The light detecting element of claim 1, further comprising:
an inter-pixel light shielding section extending between the first and second pixels, wherein light passed through the first on-chip lens is not incident on the second pixel, and wherein light passed through the second on-chip lens is not incident on the first pixel.

4. The light detecting element of claim 1, wherein the light detecting element is included in a distance measurement system.

5. The light detecting element of claim 4, wherein the light detecting element performs distance measurement using an indirect time of flight method.

6. A light detecting element, comprising:
a pixel array section including a first pixel and a second pixel adjacent each other in a first direction, wherein each of the first and second pixels generates charge corresponding to an amount of received light;
a first pixel drive line extending along the first direction; and
a second pixel drive line extending along the first direction,
wherein
the first pixel includes a first tap and a second tap adjacent each other in the first direction,
the second pixel includes a third tap and a fourth tap adjacent each other in the first direction,
the first tap, the second tap, the third tap, and the fourth tap are arranged along the first direction in this order,
the first pixel drive line is connected to the first tap and the fourth tap,
the second pixel drive line is connected to the second tap and the third tap, and
the light detecting element is a current assisted photonic demodulator (CAPD) sensor.

7. The light detecting element of claim 6, wherein the light detecting element is a back illuminated CAPD sensor.

8. The light detecting element of claim 7, wherein a surface of a substrate that includes the pixels that is opposite a light incident surface includes a stack of wiring layers.

9. The light detecting element of claim 8, wherein the first and second pixel drive lines are formed by wires included in the stack of wiring layers.

10. The light detecting element of claim 8, wherein the taps are formed on a side of the surface of the substrate opposite the light incident surface.

11. The light detecting element of claim 10, wherein the first tap is a first signal extraction section, and wherein the second tap is a second signal extraction section of the first pixel.

12. The light detecting element of claim 11, wherein an area of the first pixel between the first and second signal extraction sections includes an oxide film.

13. The light detecting element of claim 12, wherein the first signal extraction section includes:
an N+ semiconductor region;
an N− semiconductor region;
a P+ semiconductor region; and
a P− semiconductor region.

14. The light detecting element of claim 13, wherein the second signal extraction section includes:
an N+ semiconductor region;
an N− semiconductor region;
a P+ semiconductor region; and
a P− semiconductor region.

15. The light detecting element of claim 14, wherein a first separation section separates the N+ and P+ semiconductor regions of the first signal extraction region, and wherein a second separation section separates the N+ and P+ semiconductor regions of the second signal extraction region.

16. The light detecting element of claim 13, wherein the N+ semiconductor region is a suction electrode that collects charges generated by the first pixel.

17. The light detecting element of claim 16, wherein the P+ semiconductor region is an injection contact section that applies a voltage to the substrate.

* * * * *